US012613272B2

(12) United States Patent
Amponsah et al.

(10) Patent No.:  US 12,613,272 B2
(45) Date of Patent:       Apr. 28, 2026

(54) METHODS AND TECHNIQUES FOR DETERMINING WHEN A PROBE TIP IS PROXIMATE TO OR IN CONTACT WITH A SAMPLE SURFACE

(71) Applicant: Xallent Inc., Albany, NY (US)

(72) Inventors: Kwame Amponsah, Latham, NY (US); Pardeep Kumar, Ithaca, NY (US)

(73) Assignee: Xallent Inc., Albany, NY (US)

( * ) Notice: Subject to any disclaimer, the term of this patent is extended or adjusted under 35 U.S.C. 154(b) by 170 days.

(21) Appl. No.: 18/421,446

(22) Filed: Jan. 24, 2024

(65) Prior Publication Data

US 2024/0255571 A1      Aug. 1, 2024

Related U.S. Application Data

(60) Provisional application No. 63/482,489, filed on Jan. 31, 2023.

(51) Int. Cl.
*G01R 31/28*          (2006.01)
*G01R 1/073*          (2006.01)

(52) U.S. Cl.
CPC ..... *G01R 31/2887* (2013.01); *G01R 1/07307* (2013.01); *G01R 31/2891* (2013.01)

(58) Field of Classification Search
CPC ............ G01R 1/07307; G01R 1/07342; G01R 1/07385; G01R 1/36; G01R 3/00; G01R 31/2601; G01R 31/2889
See application file for complete search history.

(56) References Cited

U.S. PATENT DOCUMENTS

| | | | |
|---|---|---|---|
| 5,124,647 A | | 6/1992 | Watts |
| 6,111,419 A | * | 8/2000 | Lefever ................. G01B 7/345 |
| | | | 324/750.16 |
| 6,279,389 B1 | | 8/2001 | Adderton et al. |
| 6,538,458 B2 | | 3/2003 | Togashi et al. |
| 2002/0043101 A1 | | 4/2002 | Naitou et al. |

(Continued)

FOREIGN PATENT DOCUMENTS

| | | |
|---|---|---|
| EP | 2926111 B1 | 7/2022 |
| JP | 3003974 B2 | 1/2000 |

OTHER PUBLICATIONS

International Search Report and the Written Opinion of the Searching Authority, PCT Patent Application No. PCT/US2024/012758, dated May 27, 2024, pp. 1-11.

(Continued)

*Primary Examiner* — Tung X Nguyen
(74) *Attorney, Agent, or Firm* — Bond, Schoeneck & King, PLLC

(57) ABSTRACT

Micro and nanoscale probes are used in the semiconductor and thin film materials industries to test wafers and samples. Probes supply and measure signals to and from the sample. Signals could be electrical, mechanical, chemical, optical, or photonics. Techniques of capacitance response signal, intensity response signal, photocurrent response signal, piezoresistance response signal, a high frequency response signal, elongated image response signal, contrast response signal, electrical response signal, resonance response signal, current response signal, and/or current-in-plane response signal could be used to determine when the probe tips are in proximity or contact a sample surface.

19 Claims, 9 Drawing Sheets

(56) References Cited

U.S. PATENT DOCUMENTS

| 2004/0164758 A1* | 8/2004 | Nagar | G01R 1/07314 |
| | | | 324/755.07 |
| 2015/0008946 A1* | 1/2015 | Inoue | G01R 31/2887 |
| | | | 324/750.03 |
| 2016/0252546 A1 | 9/2016 | Amponsah | |
| 2021/0255216 A1 | 8/2021 | Matonis | |

OTHER PUBLICATIONS

Ye Yong et al: "A Review on Applications of Capacitive Displacement Sensing for Capacitive Proximity Sensor", IEEE Access, IEEE, USA, vol. 8, Feb. 29, 2020 (Feb. 29, 2020) pp. 45325-45342, XP011777644, DOI: 10.1109/ACCESS.2020.2977716.
International Preliminary Report On Patentability, PCT Patent Application No. PCT/US2024/012758, dated Jul. 31, 2025, pp. 1-8.

\* cited by examiner

700

702 — mounting a probe chip with a probe and/or
sample on at least a moveable stage 704 — instructing the moveable stage to bring at least a probe tip
into proximity or contact with the sample surface
while measuring a response signal caused by the probe
tip being in proximity or contact with the sample surface

METHODS AND TECHNIQUES FOR DETERMINING WHEN A PROBE TIP IS PROXIMATE TO OR IN CONTACT WITH A SAMPLE SURFACE

CROSS-REFERENCE TO RELATED APPLICATIONS

This application claims priority to U.S. Provisional Patent Application Ser. No. 63/482,489, filed on Jan. 31, 2023, and titled "Methods and Techniques for Determining When a Probe Tip is Proximate to or in Contact with a Sample Surface," which application is herein incorporated by reference in its entirety.

FIELD OF THE INVENTION

The present disclosure is directed generally at methods and techniques for determining when a probe tip is proximate to or in contact with a sample surface. The probe tips are used for testing semiconductors and thin film materials.

BACKGROUND

As semiconductor devices continue to scale down in size, the electrical performance of these devices has taken on an increased importance. Defects in transistors can render either part of or whole integrated circuit (IC) chips useless. For this reason, the ability to identify defects rapidly and economically during the early stages of IC manufacturing could significantly reduce device design costs, shorten manufacturing iterations, minimize wafer scraps, and accelerate time-to-market. Probes are used to make contact to semiconductors and thin film materials to extract their electrical, mechanical, chemical, and optical properties.

SUMMARY OF THE INVENTION

The present disclosure is directed generally towards methods and techniques for determining when a probe tip is either in proximity to or in contact with a sample surface or wafer.

Generally, in one aspect, a method for determining when at least a probe with at least a probe tip is in proximity to or in contact with a sample surface. The method includes mounting a probe chip with a probe and/or sample on at least a moveable stage. The method further includes instructing the moveable stage to bring at least a probe tip into proximity or contact with the sample surface while measuring a response signal caused by the probe tip being in proximity or contact with the sample surface.

According to an example, a set of fingers are monolithically integrated with the probe.

According to an example, at least a side electrode is monolithically integrated with the probe.

According to an example, a set of fingers are monolithically integrated with the side electrode.

According to an example, each finger in the set of fingers is isolated by airgaps.

According to an example, the probe chip is a multiprobe.

According to an example, the response signal is measured while the probe and/or the sample is arranged under an objective lens of a microscope.

According to an example, the response signal is a capacitance response signal, and determining that the probe tip has made contact to the sample surface further comprises the steps of (1) measuring a capacitance between the probe and at least a monolithically integrated side electrode when the probe tip is not in contact with the sample surface; (2) instructing the stage to incrementally move the probe tip into contact with the sample surface while measuring the capacitance between the probe and side electrode upon each step movement of the stage; and (3) determining that contact is achieved when there is a difference between the measured capacitance when the probe tip is not in contact with the sample surface and when the probe tip is in contact with the sample surface.

According to an example, the step movement of the stage is aborted when the probe tip contacts the sample surface.

According to an example, after aborting the step movement of the stage, a mechanical, electrical, chemical, optical, and/or photonics measurement is performed between the probe tip and the sample.

According to an example, the step movement of the stage is aborted when the capacitance response signal is equivalent to a setpoint capacitance.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, bringing the probe tip into contact with the sample surface comprises the steps of (1) selecting, using a pattern recognition algorithm, a reference location on the sample; (2) saving, in a memory of a computer, a pixel coordinate of the reference location; (3) using the pattern recognition algorithm to identify the probe tip and saving its pixel value; (4) instructing translational stages to position the reference location below the probe tip; (5) continuously adjusting the position of the translational stages to ensure that the probe tip is always positioned at the reference location on the sample surface.

According to an example, the response signal is an intensity response signal, and determining that the probe tip has made contact to the sample surface comprises the steps of: (1) directing an incidence beam at one or more interdigitated airgaps between the probe and at least a monolithically integrated side electrode; (2) using a photodetector to measure an intensity or location of a reflected beam corresponding to the incidence beam when the probe tip is not in contact with the sample surface; (3) instructing the stage to incrementally move the sample into contact with the probe tip while measuring the intensity or location of the reflected beam at each step movement of the stage; and (4) determining that contact is achieved when there is a difference between the measured intensity or location of the reflected beam when the probe tip is not in contact with the sample surface and when the probe tip is in contact with the sample surface.

According to an example, the step movement of the stage is aborted when the probe tip contacts the sample surface.

According to an example, after aborting the step movement of the stage, a mechanical, electrical, chemical, optical, and/or photonics measurement is performed between the probe tip and the sample.

According to an example, the step movement of the stage is aborted when the intensity response signal is equivalent to a setpoint intensity.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a photocurrent response signal, and determining that the probe tip has made contact to the sample surface comprises the steps of: (1) directing an incidence beam at one or more interdigitated airgaps between the probe and at least a monolithically integrated side electrode; (2) using a monolithically integrated photodetector to generate a photocurrent as a result of a transmitted beam hitting on the photodetector, wherein the transmitted beam is a transmitted portion of the incidence beam; (3) measuring the photocurrent when the probe tip is not in contact with the sample surface; (4) instructing the stage to bring the sample into contact with the probe tip while measuring the photocurrent response signal at each step movement of the stage; and (5) determining that contact is achieved when there is a difference between the measured photocurrent when the probe tip is not in contact with the sample surface and when the probe tip is in contact with the sample surface.

According to an example, the step movement of the stage is aborted when the probe tip contacts the sample surface.

According to an example, after aborting the step movement of the stage, a mechanical, electrical, chemical, optical, and/or photonics measurement is performed between the probe tip and the sample.

According to an example, the step movement of the stage is aborted when the photocurrent response signal is equivalent to a setpoint photocurrent.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a piezoresistance response signal, and determining that the probe tip has made contact to the sample surface comprises the steps of: (1) using a monolithically integrated piezoresistor of the probe to measure a piezoresistance corresponding to a deflection of the probe when the probe tip is not in contact with the sample surface; (2) instructing the stage to incrementally move the probe tip into contact with the sample surface while measuring the deflection of the probe with the monolithically integrated piezoresistor at each step movement of the stage; (3) determining that contact is achieved when there is a difference between the measured piezoresistance when the probe tip is not in contact with the sample surface and when the probe tip is in contact with the sample surface.

According to an example, the step movement of the stage is aborted when the probe tip contacts the sample surface.

According to an example, after aborting the step movement of the stage, a mechanical, electrical, chemical, optical, and/or photonics measurement is performed between the probe tip and the sample.

According to an example, the step movement of the stage is aborted when the piezoresistance response signal is equivalent to a setpoint piezoresistance.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a high frequency response signal, and determining that the probe tip has made contact to the sample surface comprises the steps of: (1) applying a high frequency signal to the probe; (2) measuring an amplitude and/or a phase of a transmitted and/or a reflected signal of the high frequency signal when the probe tip is not in contact with the sample surface; (3) instructing the stage to bring the probe tip into contact with the sample surface while measuring the amplitude and/or the phase of the transmitted and/or reflected signal of the probe at each step movement of the stage; and (4) determining that contact is achieved when there is a difference between the measured amplitude and/or phase of the transmitted and/or the reflected signal when the probe tip is not in contact with the sample surface and when the probe tip is in contact with the sample surface.

According to an example, the step movement of the stage is aborted when the probe tip contacts the sample surface.

According to an example, after aborting the step movement of the stage, a mechanical, electrical, chemical, optical, and/or photonics measurement is performed between the probe tip and the sample.

According to an example, the step movement of the stage is aborted when the measured amplitude and/or phase of the transmitted and/or reflected signal is equivalent to a setpoint amplitude and/or phase of the transmitted and/or reflected signal respectively.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is an elongated image response signal of the probe, and determining that the probe tip has made contact to the sample surface comprises the steps of: (1) using a camera to capture and view the probe; (2) instructing the stage to incrementally move the probe tip into contact with the sample surface while viewing the probe upon each step movement of the stage; (3) using the camera to view an elongation of the probe due to the probe tip pushing against the sample surface; (4) determining that contact is achieved when there is an elongated image of the probe.

According to an example, the step movement of the stage is aborted when the camera captures the elongation of the probe.

According to an example, the step movement of the stage is aborted when the probe tip contacts the sample surface.

According to an example, aborting the step movement of the stage comprises the steps of: (1) acquiring pixel coordinate values of the probe tip along with pixel coordinate values of a reference location on the probe chip while the probe is not in contact with the sample surface; (2) computing a tip-reference length between the probe tip and the reference location; (3) instructing the stage to incrementally move the probe tip into contact with the sample surface while computing the tip-reference length upon each step movement of the stage; (4) aborting the step movement of the stage when the tip-reference length when the probe tip is in contact with the sample surface is greater than the tip-reference length when the probe tip is not in contact with the sample surface.

According to an example, after aborting the step movement of the stage, a mechanical, electrical, chemical, optical, and/or photonics measurement is performed between the probe tip and the sample.

According to an example, the step movement of the stage is aborted when a tip-reference length between the probe tip and a reference location on the probe chip is equivalent to a setpoint pixel length.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a contrast response signal of the probe and/or sample, and determining that the probe tip has made contact to the sample surface comprises the steps of: (1) placing the probe and the sample inside an electron microscope; (2) instructing the stage to bring the sample into contact with the probe tip while monitoring a change in contrast or color of the probe and/or sample at each step movement of the stage; and (3) determining that contact is achieved immediately there is a change in contrast or color of the probe and/or the sample surface.

According to an example, the electron microscope is a scanning electron microscope or a transmission electron microscope.

According to an example, the step movement of the stage is aborted when there is a change in the contrast or color of the probe and/or the sample surface.

According to an example, after aborting the step movement of the stage, a mechanical, electrical, chemical, optical, and/or photonics measurement is performed between the probe tip and the sample.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is an electrical response signal, and determining that the probe tip has made contact to the sample surface comprises the steps of: (1) applying an electrical signal to a probe that is integrated with a set of fingers; (2) connecting at least a monolithically integrated side electrode that is integrated with the set of fingers to a signal measurement unit; (3) instructing the stage to incrementally move the probe tip into contact with the sample surface; (4) pushing the probe tip against the sample surface until at least one of the set of fingers on the probe contacts the fingers on the monolithically integrated side electrode causing the electrical signal to transfer from the probe to the monolithically integrated side electrode; (4) using the signal measurement unit to measure the transfer of the electrical signal from the probe to the monolithically integrated side electrode at each step movement of the stage; and (5) determining that contact is achieved when there is a transfer of electrical signal from the probe to the monolithically integrated side electrode.

According to an example, the step movement of the stage is aborted when the signal measurement unit measures the transferred electrical signal from the probe.

According to an example, after aborting the step movement of the stage, a mechanical, electrical, chemical, optical, and/or photonics measurement is performed between the probe tip and the sample.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a resonance response signal, and determining that the probe tip has made contact to the sample surface comprises the steps of: (1) exciting the probe into resonance causing the probe to vibrate; (2) measuring a resonance frequency, amplitude, and/or phase of the probe when the probe tip is not in contact with the sample surface; (3) instructing the moveable stage to incrementally move the sample into proximity or contact with the probe tip while measuring the resonance frequency, amplitude, and/or phase of the probe upon each step movement of the stage; (4) measuring a change in the resonance frequency, amplitude, and/or phase of the probe when the probe tip is in proximity or contact with the sample surface; (5) determining that contact is achieved when there is a change in the resonance frequency, amplitude, and/or phase of the probe.

According to an example, the step movement of the stage is aborted when there is a change in the resonance frequency, amplitude, and/or phase of the probe.

According to an example, after aborting the step movement of the stage, a mechanical, electrical, chemical, optical, and/or photonics measurement is performed between the probe tip and the sample.

According to an example, the step movement of the stage is aborted when the measured resonance frequency, amplitude, and/or phase when the probe tip is in proximity or contact with the sample surface is equivalent to a setpoint frequency, amplitude, and/or phase respectively.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tip and the sample.

According to an example, the response signal is a current response signal, and determining that the probe tip has made contact to the sample surface comprises the steps of: (1) applying a potential difference between the sample and the probe tip; (2) measuring a current between the probe tip and sample when the probe tip is not in contact with the sample surface; (3) instructing the stage to incrementally move the probe tip into contact with the sample surface while measuring the current between the probe tip and the sample at each step movement of the stage; (4) determining that contact is achieved when the measured current when the probe tip is not in contact with the sample surface is less than the measured current when the probe tip is in contact with the sample surface.

According to an example, the step movement of the stage is aborted when the measured current when the probe tip is not in contact with the sample surface is less than the measured current when the probe tip is in contact with the sample surface.

According to an example, after aborting the step movement of the stage, a mechanical, electrical, chemical, optical, and/or photonics measurement is performed between the probe tip and the sample.

According to an example, the step movement of the stage is aborted when a contact resistance measured when the probe tip is in contact with the sample surface is equivalent to a setpoint contact resistance.

According to an example, the step movement of the stage is continuously adjusted by a feedback controller to maintain a constant contact resistance at each location on the sample surface.

According to an example, after maintaining a constant contact resistance at each location on the sample surface, a mechanical, electrical, chemical, optical, and/or photonics measurement is performed between the probe tip and the sample.

According to an example, the probe chip is a multiprobe chip comprising a plurality of probes, each of the plurality of probes having a probe tip, and the response signal is a current-in-plane response signal, and determining that the probe tips of the plurality of probes have made contact to the sample surface comprises the steps of: (1) applying a potential difference across at least two probes of the plurality of probes; (2) measuring a current-in-plane flow between the two probes with the applied potential difference when at least two probe tips corresponding to the at least two probes are separated from the sample surface; (3) instructing the stage to incrementally move the at least two probe tips into contact with the sample surface while measuring the current flow between the at least two probes with the applied potential difference at each step movement of the stage; and (4) determining that contact is achieved when the measured current-in-plane when the probe tips are not in contact with the sample surface is less than the measured current-in-plane when the probe tips are in contact with the sample surface.

According to an example, the step movement of the stage is aborted when the measured current-in-plane when the probe tips are not in contact with the sample surface is less than the measured current-in-plane when the probe tips are in contact with the sample surface.

According to an example, after aborting the step movement of the stage, a mechanical, electrical, chemical, optical, and/or photonics measurement is performed between the probe tips and the sample.

According to an example, the step movement of the stage is aborted when the measured current-in-plane when the probe tips are in contact with the sample surface is equivalent to a setpoint current.

According to an example, the step movement of the stage is continuously adjusted by a feedback controller to maintain a constant contact force at each location on the sample surface.

According to an example, after maintaining a constant contact force at each location on the sample surface, a mechanical, electrical, chemical, optical, and/or photonics measurement is performed between the probe tips and the sample.

According to an example, the probe chip is a multiprobe chip comprising a plurality of probes, each of the plurality of probes having a probe tip, and the stage is instructed to bring the probe tips into contact or proximity with the sample surface.

According to an example, a technique of capacitance response signal, intensity response signal, photocurrent response signal, piezoresistance response signal, a high frequency response signal, elongated image response signal, contrast response signal, electrical response signal, resonance response signal, current response signal, and/or current-in-plane response signal are used to determine when the probe tips make contact to or are in proximity to the sample surface; and wherein the method further comprises applying a probing signal to at least one of the probes to modulate a charge transport in the sample.

According to an example, while the probing signal is being applied, at least two probes of the plurality of probes are used to extract a conductance, permittivity, resistance, resistivity, sheet resistance, and/or 4-wire Kelvin resistance of the sample.

According to an example, a plot of the sample's conductance, permittivity, resistance, resistivity, sheet resistance, and/or 4-wire Kelvin resistance versus amplitude or phase of the probing signal is generated.

According to an example, at least one of the plurality of probes is shorter than the other probes of the plurality of probes.

According to an example, the probing signal is a DC voltage, a high frequency signal, a magnetic signal, an optical signal, or a photonics signal.

According to an example, the probe that carries the probing signal is fixed.

According to an example, the probe that carries the probing signal is freely moveable and shorter than one or more side probes; and while the probing signal is applied to the moveable and shorter probe, at least two of the side probes are used to extract a conductance, permittivity, resistance, resistivity, sheet resistance, and/or 4-wire Kelvin resistance of the sample.

According to an example, a plot of the sample's conductance, permittivity, resistance, resistivity, sheet resistance, and/or 4-wire Kelvin resistance versus amplitude or phase of the probing signal and/or versus amplitude of an actuation voltage is generated.

According to an example, the probe that carries the probing signal is longer than one or more side probes.

According to an example, the probe that carries the probing signal is used to perform scanning probe microscopy.

According to an example, after performing the scanning probe microscopy, the side probes are used to extract the sample's conductance, permittivity, resistance, resistivity, sheet resistance, and/or 4-wire Kelvin resistance.

According to an example, at least a probe is used to capacitively couple a probing signal to the sample; and at least another probe is used to pick up a modified version of the probing signal; using the modified version of the probing signal to infer one or more material properties of the sample.

According to an example, the one or more material properties are resistivity, doping, electron and hole mobility, defects, carrier concentration, crystal structure, and/or sheet resistance.

According to an example, the sample and the probe tips are placed in either an electrolyte solution or gaseous environment.

According to an example, while the probing signal is being applied to a middle probe of the plurality of probes, a transfer curve, output curve, gate leakage curve, conductance, permittivity, resistance, resistivity, sheet resistance, and/or 4-wire Kelvin resistance measurement is performed.

In various implementations, a processor or controller may be associated with one or more storage media (generically referred to herein as "memory," e.g., volatile and non-volatile computer memory such as RAM, PROM, EPROM, EEPROM, floppy disks, compact disks, optical disks, magnetic tape, SSD, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects as discussed herein. The terms "program" or "computer program" are used herein in a generic sense to refer to any type of computer code (e.g., software or microcode) that can be employed to program one or more processors or controllers.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

These and other aspects of the various embodiments will be apparent from and elucidated with reference to the embodiment(s) described hereinafter.

BRIEF DESCRIPTION OF THE DRAWINGS

The present invention will be more fully understood and appreciated by reading the following Detailed Description in conjunction with the accompanying drawings, in which.

DETAILED DESCRIPTION OF EMBODIMENTS

The present disclosure describes various methods and techniques for determining when a probe tip is in proximity to or in contact with a sample surface by monitoring a response signal such as capacitance response signal, intensity response signal, photocurrent response signal, piezoresistance response signal, a high frequency response signal, elongated image response signal, contrast response signal, electrical response signal, resonance response signal, current response signal, and/or current-in-plane response signal. After contact is made, a constant contact force could be induced and maintained by the probe tip on the sample surface.

The ability to determine when a probe tip contacts a sample surface would mitigate situations where the probe tip accidentally punches-through the sample and destroying the sample and probe tip.

Constant contact force probing (CCFP) is a technique where a probe tip exerts a known contact force on the sample surface. The contact force could be maintained by using a feedback controller such as a proportional-integral (PI) or a proportional-integral-derivative (PID) controller. At each location on the sample surface where a constant contact force is achieved, an electrical, mechanical, optical, photonics, and/or chemical measurement could be performed. A multiprobe, which is a single chip with several probe tips, could also be used to perform constant contact force probing.

The ability to maintain a constant contact force when electrically probing a sample would ensure that a constant contact resistance is maintained between the probe tip and the sample. Thus, improving measurement repeatability and reliability.

Figure 1A:
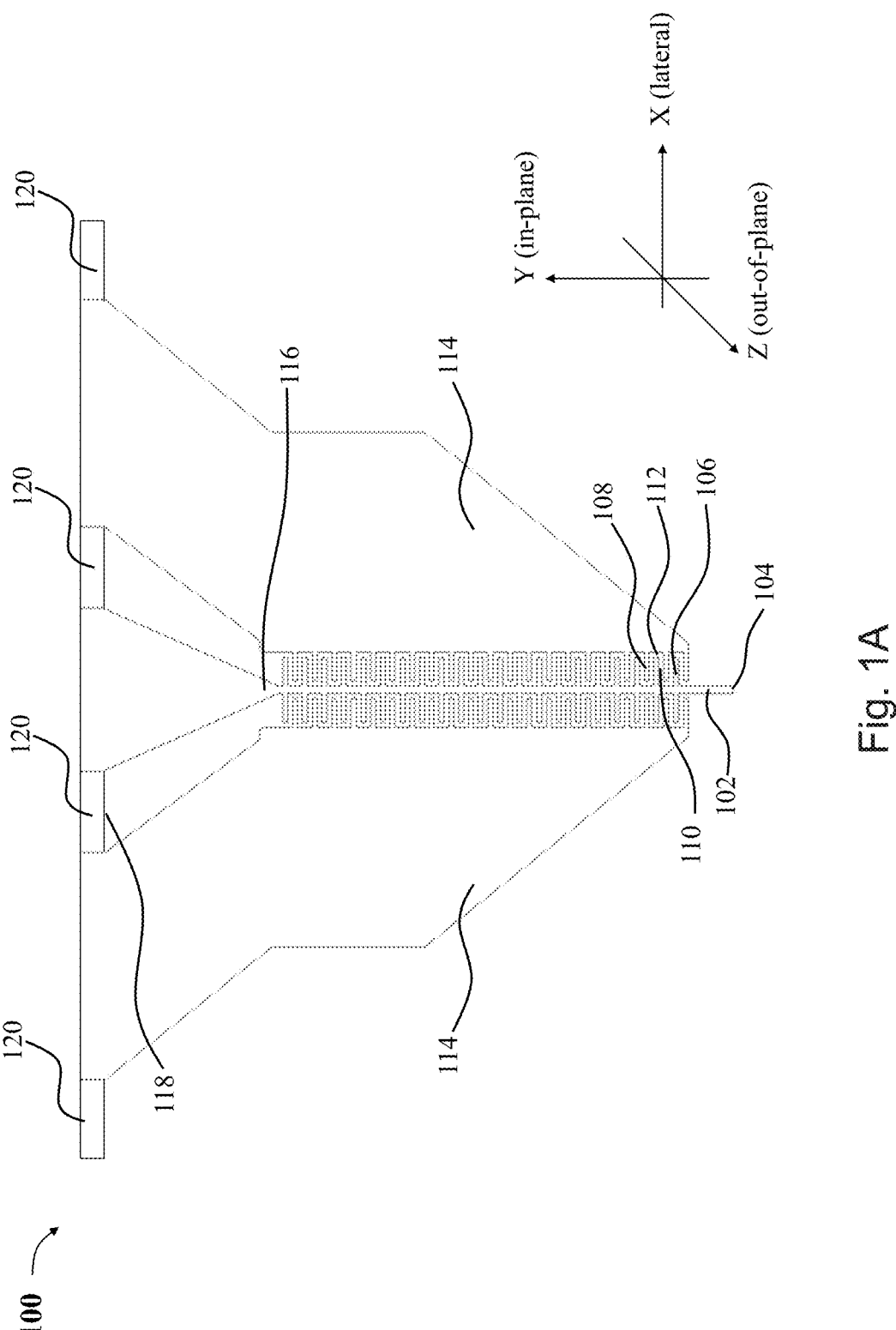
FIG. 1A is a top view of a probe chip, according to aspects of the present disclosure.

FIG. 1A illustrates a perspective view of a probe chip 100A. The probe 102 could be made of metal, an alloy, silicon, silicon nitride, silicon dioxide, polymer, or a combination thereof. The probe 102, fingers 106 and 108, and the side electrodes 114 have a finite thickness which is determined by the probe manufacturing process. The probe 102 comprises of a base 116, a set of fingers 106, and a probe tip 104. At least a side electrode 114 comprising of a set of fingers 108 is monolithically integrated with the probe 102. Horizontal airgaps 110 and vertical airgaps 112 respectively electrically isolate the probe 102 from the side electrode 114. Probe 102 is freely suspended from the substrate 120 and movable while the side electrode 114 is stationary.

Figure 1B:
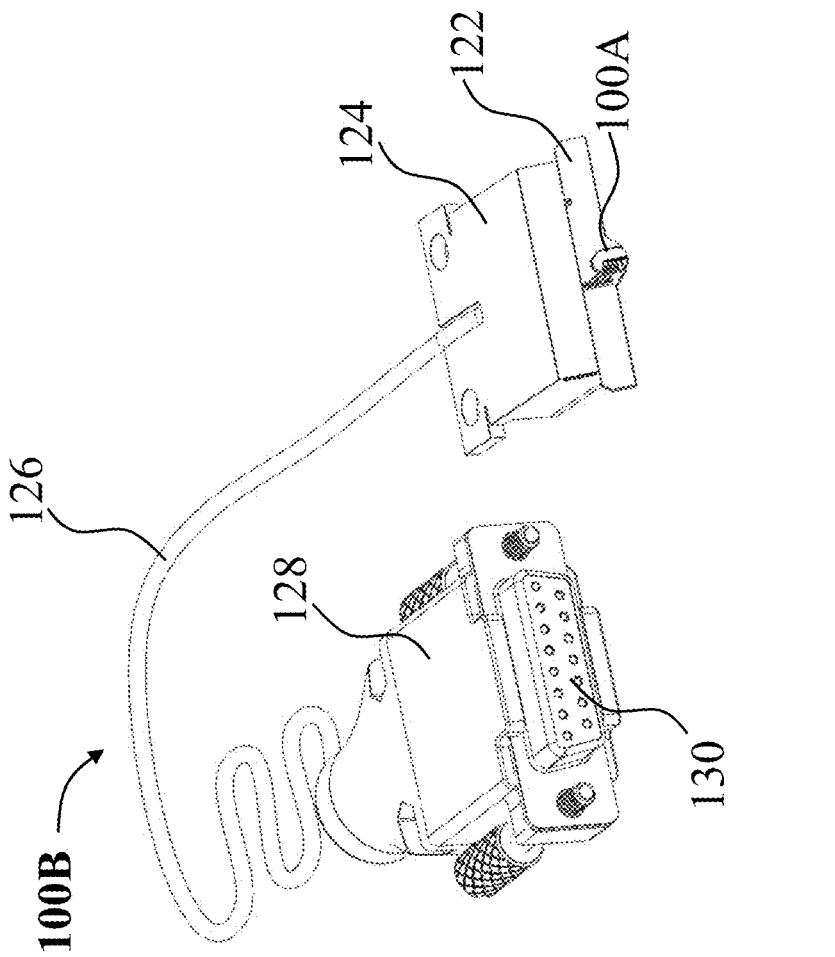
FIG. 1B is an isometric view of a probe head assembly, according to aspects of the present disclosure.

FIG. 1B is an isometric view of a probe head assembly 100B. Referring to FIG. 1B, the probe chip 100A could be affixed and wirebonded to a printed circuit board (PCB) 122. The PCB is inserted into a probe head 124. Contact pins in the probe head 124 contact the PCB 122. A cable 126 connects the contact pins to connecting pins 130 of a subminiature connector 128. The connecting pins 130 are connected to testing equipment. The testing equipment could be a source measurement unit, a vector network analyzer 178, a parameter analyzer 184, capacitance measurement unit 172, transimpedance amplifier (TIA) 180, or a lock-in amplifier 182.

Figure 1C:
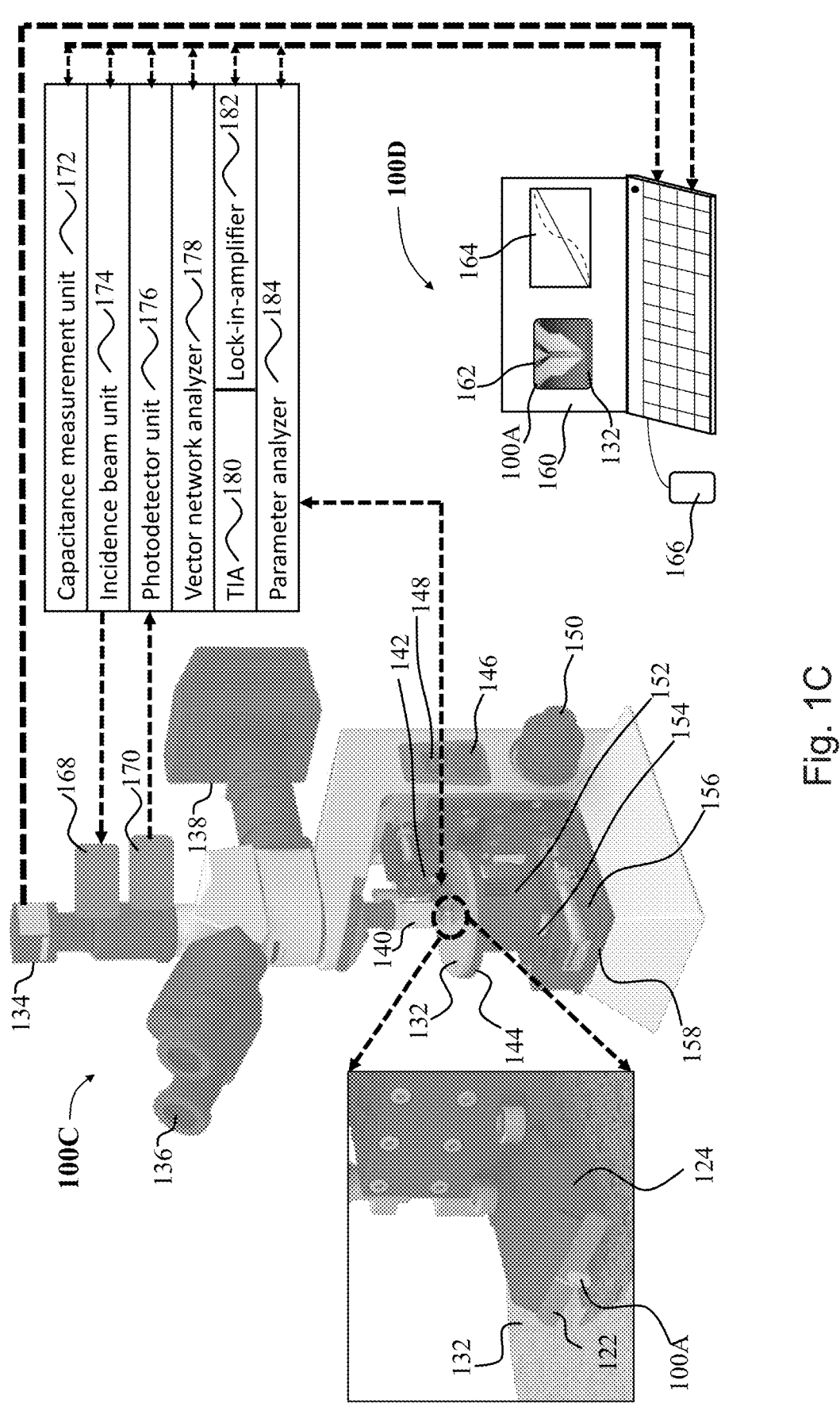
FIG. 1C is a schematic view of a system for determining when a probe tip is proximate to or in contact with a sample, according to aspects of the present disclosure.

FIG. 1C is a schematic view of a system for determining when a probe tip 104 is proximate to or in contact with a sample 132. In particular, FIG. 1C illustrates the interactions between probe chip 100A, a sample 132, microscope assembly 100C, and various types of testing equipment. The probe head 124 is attached to a probe stage 142. The PCB 122 that houses the probe chip 100A is inserted into the probe head 124. The probe chip 100A is mounted at an angle to the sample 132 (such as a semiconductor wafer). The sample 132 is placed on a chuck 144, and the chuck 144 is placed on a Z-stage 152. The Z-stage 152 is placed on a rotating stage 154. The rotating stage 154 is placed on XY-translational stages 156. The XY-translational stages 156 are screwed into a base plate 158. The stages 152, 154, 156 could be manual, piezoelectric, or stepper motor driven. The probe stage 142, the Z-stage 152, the rotating stage 154, and the XY-translational stages 156 may be used, either separately or in combination, to bring the sample 132 into contact with the probe tip 104, or to bring the probe tip 104 into contact with the sample 132. A knob 150 could be used to move the chuck 144 and sample 132 closer to or farther from the probe tip 104. A switch 148 turns on a microscope light source 138, and a knob 146 adjusts the intensity of the light source 138. The light source 138 is directed through the lens 140 to view the probe tip 104 and the sample 132. The microscope 100C is also equipped with a camera 134 and an eyepiece 136 for viewing the probe tip 104 and a surface of the sample 132. The microscope 100C could also be integrated with an incidence beam port 168 and a photodetector port 170. A capacitance measurement unit 172, a vector network analyzer (VNA) 178, a transimpedance amplifier (TIA) 180, a lock-in amplifier (LIA) 182, and/or a parameter analyzer 184 are connected to the probe head 124 through the subminiature connector 128. A computer 100D is connected to the camera 134, the capacitance measurement unit 172, the incidence beam unit 174, the photodetector unit 176, the VNA unit 178, the TIA unit 180, the LIA unit 182, and the parameter analyzer 184. A software program running on the computer 100D controls the measurement units and analyzers. The graphical user interface (GUI) of the software program is shown on the computer monitor 160. The GUI shows a panel 162 that displays an image of the probe chip 100A and the sample 132 captured by the camera 134. The GUI also shows another panel 164 that displays the measurement data. A computer mouse 166 is connected to the computer 100D to receive user input.

With continued reference to FIG. 1C, the probe 102 is mounted at an angle to the sample surface. While the probe tip 104 is not in contact with the sample surface, a capacitance measurement unit measures a capacitance across the probe 102 and at least a side electrode 114. This measured capacitance is referred to as a capacitance response signal. The stage is instructed to bring the probe tip 104 into contact with the sample surface while measuring the capacitance response signal upon each step movement of the stage. As the probe tip 104 pushes against the sample surface, the probe 102 could deflect in the lateral direction and/or out-of-plane direction in reference to the stationary side electrode 114. In the case of an out-of-plane deflection, the probe 102, along with its fingers 106, are deflected out-of-plane in reference to the stationary side electrode 114. This causes the overlap area between the fingers 106 of the probe 102 and the fingers 108 of the side electrode 114 to decrease, causing the capacitance measurement unit to measure a reduced capacitance. Contact is achieved when there is a probe deflection causing a difference between the capacitance response signal when the probe tip 104 is not in contact with the sample surface and the capacitance response signal when the probe tip 104 is in contact with the sample surface.

There is a direct relationship between the capacitance response signal, the extent of the probe deflection, and the contact force induced by the probe tip 104 on the sample surface. The probe's deflection, capacitance response signal, and contact force could be calibrated against a commercially available load cell. The load cell could push against the probe tip 104 with known contact forces and displacements. The load cell could be instructed to apply different contact forces and displacements to the probe tip 104 while measuring corresponding capacitance response signals. A calibration plot of capacitance response signal versus contact force, and capacitance response signal versus displacement could be generated. Thus, for the probe tip to maintain a constant contact force on the sample surface, the probe tip 104 could be pushed against the sample surface until the measured capacitance response signal corresponds to the desired contact force on the calibrated capacitance response signal versus contact force plot. Once the desired contact force is achieved, the stage movement could be aborted and a mechanical, electrical, chemical, optical, and/or photonics measurement performed between the probe tip and the sample. It should be noted that the contacting of the probe tip 104 to the sample surface could be performed under the guidance of a microscope and/or camera. Nonetheless, a microscope and/or camera are not required to enable the bringing of the probe tip 104 into contact with the sample surface.

The capacitance response signal technique allows for the probe tip 104 to safely contact conducting, semiconducting, and nonconducting samples while maintaining the integrity of the probe tip and sample.

To perform constant contact force probing, a setpoint capacitance that corresponds to a desired contact force is selected from the capacitance response signal versus contact force plot. The stage is instructed to bring the probe tip 104 into contact with the sample surface. Constant contact force is achieved when the capacitance response signal is equivalent to the setpoint capacitance. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint capacitance and a capacitance response signal and process the difference. The processed capacitance difference is used to continuously adjust the movement of the stage to ensure that the capacitance response signal is equivalent to the setpoint capacitance. By so doing, the probe tip 104 could induce a constant contact force on the sample surface for longer durations while a mechanical, electrical, chemical, optical, and/or photonics measurement are performed between the probe tip and the sample.

The microscope 100C along with other testing equipment such as scanning electron microscopes (SEM), transmission electron microscopes (TEM), probers, etc. have intrinsic drift due to differences in the coefficient of thermal expansion of the various parts that make up the equipment. Drift in this equipment could cause the probe tip 104 or sample to drift in the X, Y, and Z directions. Thus, maintaining a constant contact force while compensating for drift would require the probe 102 and/or sample to be placed on translation stages. A computer vision routine could be deployed to track and continuously reposition the probe tip 104 onto the area-of-interest on the sample surface. In computer vision, software algorithms are used to process camera images to automate identification and recognition of features-of-interest. Computer vision coupled with robotics offer autonomous navigation and data acquisition. Thus, specific to the probing of a sample 132, the moveable stages 152, 154, 156 are the robotic components while the camera 134 captures an image of the probe 102 and sample 132, and software algorithms such as pattern recognition are applied to the images. Based on the information that the software gathers from the acquired images, the software instructs the stages 152, 154, 156 to move or remain static. A microscope 100C that is equipped with a camera 134 and computer 100D are used to capture an image or video stream of the probe tip 104 and an area-of-interest. From the video stream, pattern recognition algorithms could be used to determine one or more edges of the area-of-interest and a reference location within the area-of-interest on the sample surface is chosen. The pixel coordinates of the reference location are computed. The reference location could be the center of the area-of-interest. Next, the pixel coordinates of the probe tip 104 is also computed using a pattern recognition algorithm or by mouse-clicking on the tip. The pixel coordinate values for the reference location and probe tip 104 are saved. A pixel length is calculated between the probe tip 104 and reference location. With the step motion of the XY-stages calibrated against the pixel length, the probe tip 104 and reference location could be continuously monitored, and the XY-stages are translated to bring the probe tip 104 to the reference location. Thereafter, the Z-stage is instructed to bring the probe tip 104 into contact with the reference location, while a first feedback controller is used to ensure that a constant contact force is maintained between the probe tip 104 and the sample surface. At any time, if the probe tip 104 or sample drifts, the XY-stages are translated to reposition the probe tip 104 at the reference location. A second feedback controller could be used to instruct the XY-stages to move the reference location below the probe tip 104. The job of the second feedback controller is to continuously minimize the pixel length such that the probe tip is always located at the reference location.

In another embodiment, the probe tip 104 is pushed against the sample surface such that the probe 102 deflects in the lateral direction. A capacitance or displacement measurement unit or meter could be connected across the probe 102 and side electrode(s) 114 to measure the capacitance as the probe tip 104 is pushed against the sample. All the capacitance response signal techniques described above for determining when the probe tip 104 contacts the sample surface, constant contact force probing, and drift compensation, could be applied to this embodiment.

In another embodiment, determining that the probe tip 104 has made contact to the sample involves the steps of using an incidence beam unit 174 to generate a beam such as a laser beam. The beam is transported through the incidence beam port 168 on the microscope 100C. The lens 140 aligns the incidence beam on the interdigitated fingers (formed by the fingers 106 of the probe 102 and the fingers 108 of the side electrode 114) and measuring the intensity and location of the reflected beam with a photodetector unit 176. The photodetector could be a quadrature photodetector. The probe chip 100 and/or sample could be mounted on at least a moveable stage, and the stage could be manual, piezoelectric, or stepper motor driven. The probe 102 is mounted at an angle relative to the sample surface. While the probe tip 104 is not in contact with the sample surface, the intensity and location of the reflected beam is sent through the photodetector port 170 to the photodetector unit 176. The intensity or location of the reflected beam is converted into the intensity response signal. The stage is instructed to bring the probe tip 104 into contact with the sample surface while measuring the intensity response signal upon each step movement of the stage. As the probe tip 104 pushes against the sample surface, the probe 102 could deflect in the lateral direction and/or out-of-plane directions in reference to the stationary side electrode 114. As the probe 102 deflects, a different intensity or location of the beam will be recorded by the photodetector. Contact is achieved when there is a difference between the intensity response signal when the probe tip 104 is not in contact with the sample surface and when the probe tip 104 is in contact with the sample surface.

There is a direct relationship between the intensity response signal, the extent of the probe deflection, and the contact force induced by the probe tip 104 on the sample surface. The probe's deflection, intensity response signal, and contact force could be calibrated against a commercially available load cell. The load cell could push against the probe tip 104 with known contact forces and displacements. The load cell could be instructed to apply different contact forces and displacements to the probe tip 104 while measuring corresponding intensity response signals. A calibration plot of intensity response signal versus contact force, and intensity response signal versus displacement could be generated. Thus, for the probe tip 104 to maintain a constant contact force on the sample surface, the probe tip 104 could be pushed against the sample surface until the measured intensity response signal corresponds to the desired contact force from the calibrated intensity response signal versus contact force plot. Once the desired contact force is achieved, the stage movement could be aborted and a mechanical, electrical, chemical, optical, and/or photonics measurement performed between the probe tip 104 and the sample. It should be noted that the contacting of the probe tip 104 to the sample surface could be performed under the guidance of a microscope and/or camera.

The intensity response signal technique allows for the probe tip 104 to safely contact conducting, semiconducting, and nonconducting samples while maintaining the integrity of the probe tip and sample.

To perform constant contact force probing, a setpoint intensity that corresponds to a desired contact force is selected from the intensity response signal versus contact force plot. The stage is instructed to bring the probe tip 104 into contact with the sample surface. Constant contact force is achieved when the intensity response signal is equivalent to the setpoint intensity. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint intensity and an intensity response signal and process the difference. The processed intensity difference is used to continuously adjust the movement of the stage to ensure that the intensity response signal is equivalent to the setpoint intensity. By so doing, the probe tip 104 could induce a constant contact force on the sample surface for longer durations while a mechanical, electrical, chemical, optical, and/or photonics measurement are performed between the probe tip and the sample.

In another embodiment, a photodetector is monolithically integrated with the probe 102 on the same substrate 120. The photodetector is located below the interdigitated fingers 106, 108. The photodetector could be a diode, PN-junction, or PIN-junction. A parameter analyzer 184 applies a potential difference across the monolithically integrated photodetector and the same parameter analyzer 184 measures the photocurrent flowing through the monolithically integrated photodetector. Determining that the probe tip 104 has made contact to the sample involves the steps of using the incidence beam unit 174 to generate an incidence beam and transporting the beam through the incidence beam port 168 through the lens 140 to the monolithically integrated photodetector, and measuring a photocurrent generated by the transmitted beam portion of the incidence beam that hits the monolithically integrated photodetector. The probe chip 100 and/or sample could be mounted on at least a moveable stage, and the stage could be manual, piezoelectric, or stepper motor driven. The probe 102 is mounted at an angle to the sample surface. While the probe tip 104 is not in contact with the sample surface, the photocurrent is recorded by the parameter analyzer 184. The photocurrent generated by the transmitted beam striking the photodetector is referred to as the photocurrent response signal. The stage is instructed to bring the probe tip 104 into contact with the sample surface while measuring the photocurrent response signal upon each step movement of the stage. As the probe tip 104 pushes against the sample surface, the probe 102 could deflect in the lateral direction and/or out-of-plane directions in reference to the stationary side electrode 114. As the probe 102 deflects, the width of the airgaps 110 and 112 will change resulting in a change in the intensity of the transmitted beam. Thus, a different photocurrent will be recorded by the parameter analyzer 184. Contact is achieved when there is a difference between the photocurrent response signal when the probe tip 104 is not in contact with the sample surface and when the probe tip 104 is in contact with the sample surface.

There is a direct relationship between the photocurrent response signal, the extent of the probe deflection, and the contact force induced by the probe tip 104 on the sample surface. The probe's deflection, photocurrent response signal, and contact force could be calibrated against a commercially available load cell. The load cell could push against the probe tip 104 with known contact forces and displacements. The load cell could be instructed to apply different contact forces and displacements to the probe tip 104 while measuring corresponding photocurrent response signals. A calibration plot of photocurrent response signal versus contact force, and photocurrent response signal versus displacement could be generated. Thus, for the probe tip 104 to maintain a constant contact force on the sample surface, the probe tip 104 could be pushed against the sample surface until the measured photocurrent response signal corresponds to the desired contact force from the calibrated photocurrent response signal versus contact force plot. Once the desired contact force is achieved, the stage movement could be aborted and a mechanical, electrical, chemical, optical, and/or photonics measurement performed between the probe tip 104 and the sample. It should be noted that the contacting of the probe tip 104 to the sample surface could be performed under the guidance of a microscope and/or camera.

The photocurrent response signal technique allows for the probe tip 104 to safely contact conducting, semiconducting, and nonconducting samples while maintaining the integrity of the probe tip and sample.

To perform constant contact force probing, a setpoint photocurrent that corresponds to a desired contact force is selected from the photocurrent response signal versus contact force plot. The stage is instructed to bring the probe tip 104 into contact with the sample surface. Constant contact force is achieved when the photocurrent response signal is equivalent to the setpoint photocurrent. Thereafter, a mechanical, electrical, chemical, optical, and/or photonics measurement could be performed between the probe tip 104 and the sample.

In a scenario where a constant contact force needs to be maintained for several seconds, minutes, hours, or days, a first feedback controller could be used. The goal of the feedback controller is to calculate the difference between a setpoint photocurrent and a photocurrent response signal and process the difference. The processed photocurrent difference is used to continuously adjust the movement of the stage to ensure that the photocurrent response signal is equivalent to the setpoint photocurrent. By so doing, the probe tip 104 could induce a constant contact force on the sample surface for longer durations while a mechanical, electrical, chemical, optical, and/or photonics measurement are performed between the probe tip and the sample.

In another embodiment, a piezoresistor is monolithically integrated at the base 116 of the probe 102. Determining that the probe tip 104 has made contact to the sample involves the steps of measuring the probe's piezoresistance as the probe 102 deflects. The piezoresistor is configured as a 4-wire Kelvin structure. The parameter analyzer 184 is connected to the 4-wire Kelvin structure and it sources current through the outer electrodes while measuring voltage drop across the middle electrodes of the 4-wire Kelvin structure. The piezoresistance is calculated as the measured voltage divided by the sourced current. The probe chip 100 may or may not have side electrode 114. The probe chip 100 and/or sample could be mounted on at least a moveable stage, and the stage could be manual, piezoelectric, or stepper motor driven. The probe 102 is mounted at an angle to the sample surface. While the probe tip 104 is not in contact with the sample surface, the probe's piezoresistance is recorded by the parameter analyzer 184. The measured piezoresistance is referred to as the piezoresistance response signal. The stage is instructed to bring the probe tip 104 into contact with the sample surface while measuring the piezoresistance response signal upon each step movement of the stage. As the probe tip 104 pushes against the sample surface, the probe 102 could deflect in the lateral direction and/or out-of-plane direction in reference to the stationary side electrode 114. As the probe 102 deflects, different piezoresistances will be recorded by the parameter analyzer 184. Contact is achieved when there is a difference between the piezoresistance response signal when the probe tip 104 is not in contact with the sample surface and when the probe tip 104 is in contact with the sample surface.

There is a direct relationship between the piezoresistance response signal, the extent of the probe deflection, and the contact force induced by the probe tip 104 on the sample surface. The probe's deflection, piezoresistance response signal, and contact force could be calibrated against a commercially available load cell. The load cell could push against the probe tip 104 with known contact forces and displacements. The load cell could be instructed to apply different contact forces and displacements to the probe tip 104 while measuring corresponding piezoresistance response signals. A calibration plot of piezoresistance response signal versus contact force, and piezoresistance response signal versus displacement could be generated. Thus, for the probe tip 104 to maintain a constant contact force on the sample surface, the probe tip 104 could be pushed against the sample surface until the measured piezoresistance response signal corresponds to the desired contact force from the calibrated piezoresistance response signal versus contact force plot. Once the desired contact force is achieved, the stage movement could be aborted and a mechanical, electrical, chemical, optical, and/or photonics measurement performed between the probe tip and the sample. It should be noted that the contacting of the probe tip 104 to the sample surface could be performed under the guidance of a microscope and/or camera.

The piezoresistance response signal technique allows for the probe tip 104 to safely contact conducting, semiconducting, and nonconducting samples while maintaining the integrity of the probe tip and sample.

To perform constant contact force probing, a setpoint piezoresistance that corresponds to a desired contact force is selected from the piezoresistance response signal versus contact force plot. The stage is instructed to bring the probe tip 104 into contact with the sample surface. Constant contact force is achieved when the piezoresistance response signal is equivalent to the setpoint piezoresistance. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint piezoresistance and a piezoresistance response signal and process the difference. The processed piezoresistance difference is used to continuously adjust the movement of the stage to ensure that the piezoresistance response signal is equivalent to the setpoint piezoresistance. By so doing, the probe tip 104 could induce a constant contact force on the sample surface for longer durations while a mechanical, electrical, chemical, optical, and/or photonics measurement are performed between the probe tip and the sample.

In another embodiment, determining that the probe tip 104 has made contact to the sample involves the steps of using a vector network analyzer (VNA) 178 or a similar equipment to apply a high frequency signal to the probe 102 and using the same VNA 178 to measure the amplitude and/or phase of the reflected and/or transmitted high frequency signal. The probe chip 100 may or may not have side electrode 114. The probe chip 100 and/or sample could be mounted on at least a moveable stage, and the stage could be manual, piezoelectric, or stepper motor driven. The probe 102 is mounted at an angle to the sample surface. While the probe tip 104 is not in contact with the sample surface, the amplitude and phase of the reflected and/or transmitted high frequency signal is recorded by the vector network analyzer 178. The measured amplitude and/or phase of the reflected and/or transmitted high frequency signal is referred to as the high frequency response signal. The stage is instructed to bring the probe tip 104 into contact with the sample surface while measuring the amplitude and/or phase of the high frequency response signal upon each step movement of the stage. As the probe tip 104 contacts and pushes against the sample surface, the probe tip 104 would transmit or reflect the high frequency signal resulting in the vector network analyzer 178 measuring a different high frequency response signal. Contact is achieved when there is a difference between the high frequency response signal when the probe tip 104 is not in contact with the sample surface and when the probe tip 104 is in contact with the sample surface.

There is a direct relationship between the measured amplitude and/or phase of the high frequency response signal, the extent of the probe deflection, and the contact force induced by the probe tip 104 on the sample surface. The probe's deflection, amplitude and/or phase of the high frequency response signal, and contact force could be calibrated against a commercially available load cell. The load cell could push against the probe tip 104 with known contact forces and displacements. The load cell could be instructed to apply different contact forces and displacements to the probe tip 104 while measuring corresponding amplitude and/or phase of the high frequency response signals. A calibration plot of the amplitude and/or phase of the high frequency response signal versus contact force, and the amplitude and/or phase of the high frequency response signal versus displacement could be generated. Thus, for the probe tip to maintain a constant contact force on the sample surface, the probe tip 104 could be pushed against the sample surface until the measured amplitude and/or phase of the high frequency response signal corresponds to the desired contact force from the calibrated amplitude and/or phase of the high frequency response signal versus contact force plot. Once the desired contact force is achieved, the stage movement could be aborted and a mechanical, electrical, chemical, optical, and/or photonics measurement performed between the probe tip and the sample. It should be noted that the contacting of the probe tip 104 to the sample surface could be performed under the guidance of a microscope and/or camera.

The high frequency response signal technique allows for the probe tip 104 to safely contact conducting, semiconducting, and nonconducting samples while maintaining the integrity of the probe tip and sample.

To perform constant contact force probing, a setpoint amplitude and/or phase of the high frequency signal that corresponds to a desired contact force is selected from the amplitude and/or phase of the high frequency response signal versus contact force plot. The stage is instructed to bring the probe tip 104 into contact with the sample surface. Constant contact force is achieved when the amplitude and/or phase of the high frequency response signal is equivalent to the setpoint amplitude and/or phase of the high frequency signal. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint amplitude and/or phase of the high frequency signal and the amplitude and/or phase of the high frequency response signal and process the difference. The processed amplitude and/or phase of the high frequency signal difference is used to continuously adjust the movement of the stage to ensure that the amplitude and/or phase of the high frequency response signal is equivalent to the setpoint amplitude and/or phase of the high frequency signal. By so doing, the probe tip 104 could induce a constant contact force on the sample surface for longer durations while a mechanical, electrical, chemical, optical, and/or photonics measurement are performed between the probe tip and the sample.

In another embodiment, determining that the probe tip 104 has made contact to the sample involves the steps of viewing a change in contrast or color of the probe 102 and/or sample. The probe chip 100 may or may not have side electrode 114. The probe chip 100 and/or sample could be mounted on at least a moveable stage, and the stage could be manual, piezoelectric, or stepper motor driven. The probe 102 is mounted at an angle to the sample surface. The probe 102 and sample are mounted inside an electron microscope such as a scanning electron microscope (SEM) or transmission electron microscope (TEM). As the electron beam irradiates the probe 102 and the sample, it deposits charges on them. The stage is instructed to bring the probe tip 104 into contact with the sample surface while monitoring the change in contrast or color of the probe and/or sample upon each step movement of the stage. When the probe tip 104 makes initial contact with the sample, there is a flow of charges between the probe 102 and sample. This charge flow could be observed as a change in contrast or color of the probe and/or sample. The change in contrast or color of the probe 102 and/or sample is referred to as the contrast response signal. The SEM or TEM generates an image or video of the probe 102 and the sample 132. This image is displayed in panel 162 of the GUI. By observing the color or contrast change from the panel 162, the stage movement could be terminated when there is a change in color or contrast of the probe 102 and/or sample 132. A software algorithm could be used to monitor this change in contrast or color of the probe 102 and/or sample 132 and automatically instruct the stage to abort movement. After aborting the stage movement, a mechanical, electrical, chemical, optical, and/or photonics measurement could be performed between the probe tip and the sample.

The change in contrast technique allows for the probe tip 104 to safely contact conducting, semiconducting, and non-conducting samples while maintaining the integrity of the probe tip and sample.

To perform constant contact force probing, the stage is instructed to apply a known overdrive to further push the probe tip 104 against the sample surface. Thereafter, a mechanical, electrical, chemical, optical, and/or photonics measurement could be performed between the probe tip 104 and the sample.

In a scenario wherein a constant contact force needs to be maintained for several seconds, minutes, hours, or days, a first feedback controller could be used. The goal of the feedback controller is to determine the stage position when the probe tip 104 makes initial contact with the sample surface and instructing the stage to further apply a known stage overdrive. The stage's position is continuously adjusted by the feedback controller to maintain the overdrive. By so doing, the probe tip 104 could induce a constant contact force on the sample surface for longer durations while a mechanical, electrical, chemical, optical, and/or photonics measurement are performed between the probe tip and the sample.

In another embodiment, determining that the probe tip 104 has made contact to the sample involves the steps of measuring a transferred electrical signal across the probe 102 and the side electrode 114. The electrical signal could be a voltage. The probe chip 100 and/or sample could be mounted on at least a moveable stage, and the stage could be manual, piezoelectric, or stepper motor driven. The probe 102 is mounted at an angle to the sample surface. An electrical signal is applied to either the probe 102 or side electrode 114. As an example, a signal measurement unit is connected to the side electrode 114. The signal measurement unit could be a parameter analyzer 184. The first terminal of a parameter analyzer 184 applies the electrical signal to the probe 102 and the side electrode 114 is connected to a second terminal of the parameter analyzer 184. While the probe tip 104 is not in contact with the sample surface, electrical readings are measured by the second terminal of the parameter analyzer 184. The electrical readings measured by the second terminal are referred to as the electrical response signal. The stage is instructed to bring the probe tip 104 into contact with the sample surface while measuring the electrical response signal upon each step movement of the stage. As the probe tip 104 pushes against the sample surface, the probe 102 could deflect in the lateral direction and/or out-of-plane direction in reference to the stationary side electrode 114. This probe deflection could cause fingers 106 to mechanically contact fingers 108, thus causing the transfer of electrical signal from the probe 102 to the side electrode 114. Contact is achieved when there is a difference between the electrical response signal when the probe tip 104 is not in contact with the sample surface and when the fingers 106 and 108 are in mechanical and electrical contact.

There is a direct relationship between the extent of the probe deflection, and the contact force induced by the probe tip 104 on the sample surface. The probe's deflection and contact force could be calibrated against a commercially available load cell. The load cell could push against the probe tip 104 with known contact forces and displacements. The load cell could be instructed to apply different contact forces and displacements to the probe tip 104 while measuring corresponding electrical response signals. Of interest is the contact force and displacement that causes fingers 106 to electrically short to fingers 108. Thus, for the probe tip 104 to maintain a constant contact force on the sample surface, the probe tip 104 could be pushed against the sample surface until fingers 106 are electrically shorted to fingers 108. Once the desired contact force is achieved, the stage movement could be aborted and a mechanical, electrical, chemical, optical, and/or photonics measurement performed between the probe tip 104 and the sample. It should be noted that the contacting of the probe tip 104 to the sample surface could be performed under the guidance of a microscope and/or camera. Nonetheless, a microscope and/or camera are not required to enable the bringing of the probe tip 104 into contact with the sample surface.

The electrical response signal technique allows for the probe tip 104 to safely contact conducting, semiconducting, and nonconducting samples while maintaining the integrity of the probe tip and sample.

To perform constant contact force probing, the stage is instructed to bring the probe tip 104 into contact with the sample surface. Constant contact force is achieved when there is an electrical response signal. Thereafter, a mechanical, electrical, chemical, optical, and/or photonics measurement could be performed between the probe tip 104 and the sample.

In a scenario where a constant contact force needs to be maintained for several seconds, minutes, hours, or days, a first feedback controller could be used. The goal of the feedback controller is to continuously adjust the movement of the stage to ensure that fingers 106, 108 are always electrically shorted. By so doing, the probe tip 104 could induce a constant contact force on the sample surface for longer durations while a mechanical, electrical, chemical, optical, and/or photonics measurement are performed between the probe tip and the sample.

Figure 2:
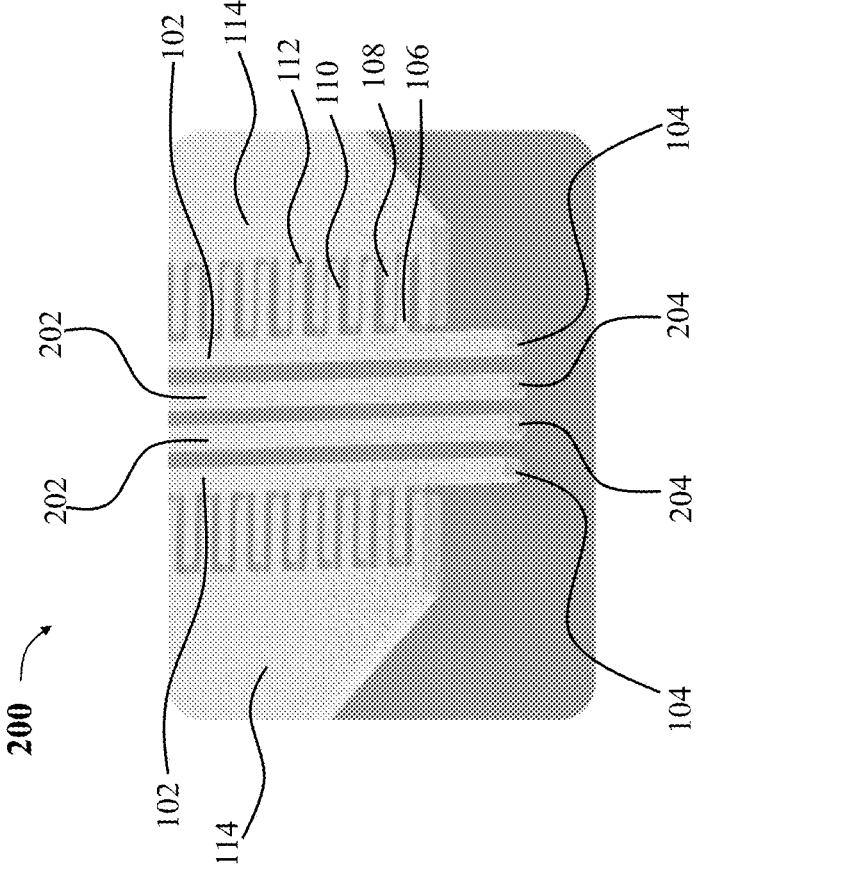
FIG. 2 is an isometric view of a multiprobe chip, according to aspects of the present disclosure.

In another embodiment, as shown in FIG. 2, a multiprobe chip 200 is provided. Multiple probes 102, 202 and side electrodes 114 are monolithically integrated on the same substrate 120 (not shown). The probes 102, 202 are freely moveable, and the side electrodes 114 are fixed. One or more capacitance measurement units could be applied across at least a probe 102 and at least a side electrode 114. The technique of the aforementioned capacitance response signal, intensity response signal, photocurrent response signal, piezoresistance response signal, a high frequency response signal, elongated image response signal, contrast response signal, electrical response signal, resonance response signal, current response signal, and/or current-in-plane response signal could be used to determine when the probe tips make contact to or are in proximity to the sample surface. The multiple probes 102, 202 could also be used for constant force probing. In addition, the probe chip 200 could be used to extract a sheet resistance or perform 4-wire Kelvin resistance measurements by sourcing current across the outer probe tips 104 and measuring the voltage drop across the inner probe tips 204.

Figure 3:
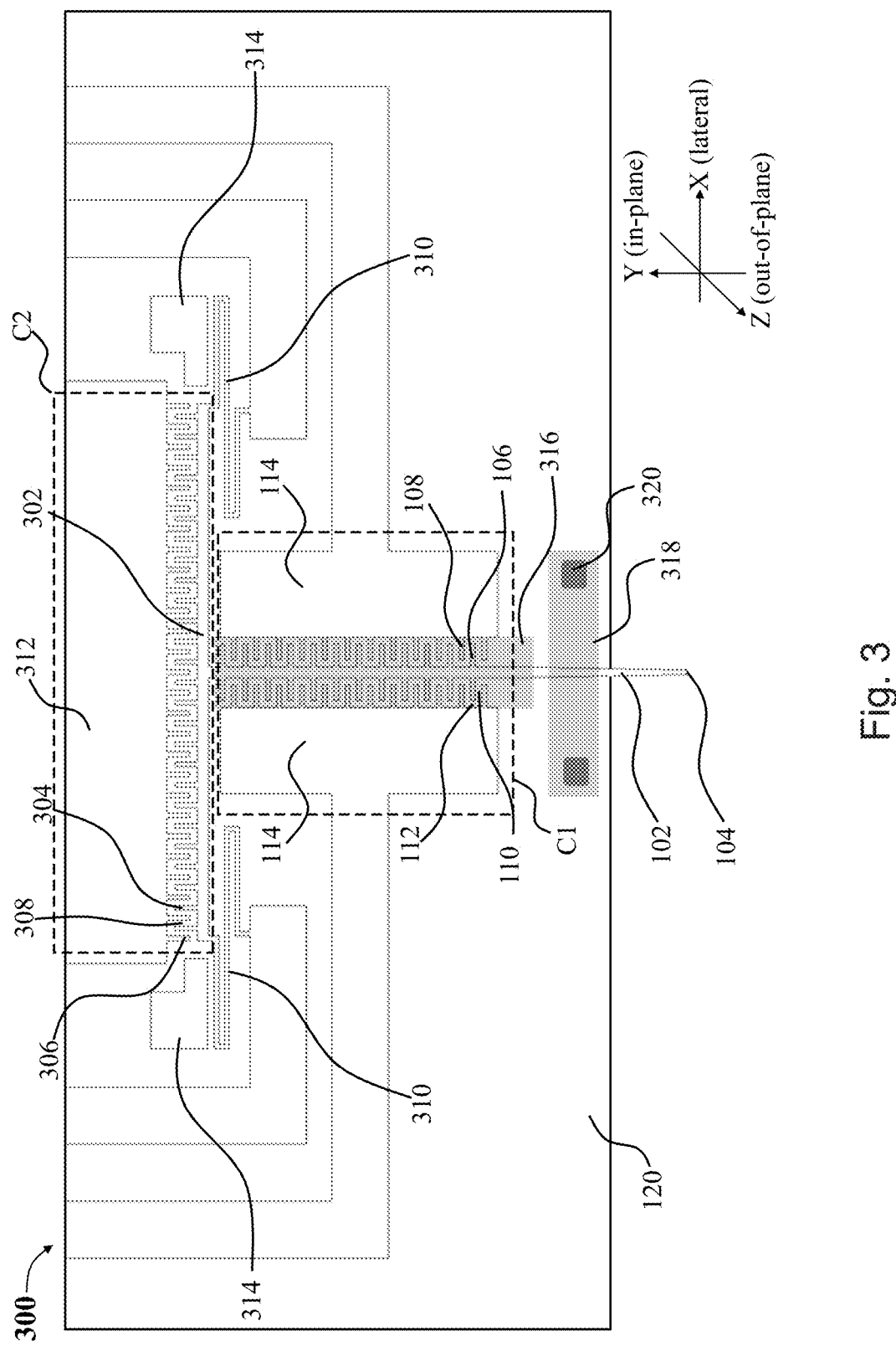
FIG. 3 is a top view of a probe chip, according to aspects of the present disclosure.

In another embodiment as shown in FIG. 3 is a probe chip 300 with multiple comb-drives. The probe 102 is freely moveable. A first comb-drive C1 comprises a portion of probe 102, fingers 106, airgaps 110 and 112, fingers 108, and side electrode 114. A second comb-drive C2 comprises of beam 302, fingers 304, airgap 308, fingers 306, and actuation electrode 312. Beam 302 is connected to the probe 102 and the meander springs 310. The meander springs 310 and beam 302 are also freely moveable. When the probe tip 104 is pushed against a sample surface, the probe 102 could deflect out-of-plane, in-plane, or laterally. Comb-drive 1 is like FIG. 1A and all the technique of capacitance response signal, intensity response signal, photocurrent response signal, piezoresistance response signal, a high frequency response signal, elongated image response signal, contrast response signal, electrical response signal, resonance response signal, current response signal, and/or current-in-plane response signal could be used to determine when the probe tip makes contact to or is in proximity to the sample surface. The probe chip 300 could also be used for constant force probing.

Referring to FIG. 3, in another embodiment, the meander springs 310 are piezoresistors or strain gauges where their resistance changes upon deflection of the probe 102. A load cell could be used to determine the relationship between probe deflection, contact force, and piezoresistance.

Referring to FIG. 3, in another embodiment, there is a bottom electrode 316 below the probe 102. There is an airgap between the bottom electrode and probe 102. By connecting a capacitance measurement unit 172 between the probe 102 and the bottom electrode 316, deflections in the probe 102 could be measured as a change in capacitance. If the probe tip 104 is pushed against a sample surface, the change in capacitance across the bottom electrode 316 and probe 102 is directly proportional to the contact force applied by the probe tip 104 to the sample surface.

Referring to FIG. 3, in another embodiment, there is a top electrode 318 above probe 102. There is an airgap between the top electrode 318 and probe 102. By connecting a capacitance measurement unit 172 across probe 102 and the top electrode 318, deflections in probe 102 could be measured as a change in capacitance. If the probe tip 104 is pushed against a sample surface, the change in capacitance across the top electrode 318 and probe 102 is directly proportional to the contact force applied by the probe tip 104 to the sample surface. Contact vias 320 connect the top electrode 318 to metal electrodes (not shown). The metal electrodes are connected to the capacitance measurement unit 172.

Referring to FIG. 3, in another embodiment, the probe 102 is excited into resonance by using a lock-in amplifier 182 (see FIG. 1C) to apply a combination of AC and DC signals to electrode 312 which would electrostatically vibrate beam 302. A parameter analyzer 184 (see FIG. 1C) is used to apply a potential difference between the probe 102 and at least a side electrode 114. The vibration of the probe 102 generates a motional current between the probe 102 and the side electrode 114. A transimpedance amplifier 180 (see FIG. 1C) that is connected to the side electrode 114 could convert the motional current into a motional voltage. Then, the lock-in amplifier 182 could be used to process the motional voltage to extract the resonance frequency, phase, and amplitude of the vibrating probe 102. As the probe tip 104 approaches the sample surface, its resonance frequency, phase, and/or amplitude could change due to attractive and repulsive forces that exist between the probe tip 104 and sample surface. Upon initial contact of the probe tip 104 with the sample surface, the resonance amplitude will remain constant. By tracking the resonance amplitude, phase, and/or frequency, one could detect when the probe tip 104 makes initial contact with the sample surface.

Referring to FIG. 3, determining that the probe tip 104 has made contact to the sample surface involves the steps of exciting the probe 102 into resonance and measuring and tracking the resonance frequency, amplitude, and/or phase of the probe. The probe chip 300 and/or sample could be mounted on at least a moveable stage, and the stage could be manual, piezoelectric, or stepper motor driven. The probe 102 is mounted at an angle to the sample surface. While the probe tip 104 is not in contact with the sample surface, its resonance frequency, phase, and/or amplitude are measured. The measured resonance frequency, phase, and/or amplitude is referred to as the resonance response signal. The stage is instructed to bring the probe tip 104 into proximity or contact with the sample surface while measuring the resonance response signal upon each step movement of the stage. As the probe tip 104 pushes against the sample surface, the probe 102 could deflect in the lateral direction and/or out-of-plane direction in reference to the stationary side electrode 114. As the probe 102 deflect due to it making contact to the sample surface, a different resonance response signal will be measured. Contact is achieved when there is a difference between the resonance response signal when the probe tip 104 is not in contact with the sample surface and when the probe tip 104 is in contact with the sample surface.

There is a direct relationship between the resonance response signal, the extent of the probe deflection, and the contact force induced by the probe tip 104 on the sample surface. The probe's deflection, resonance response signal, and contact force could be calibrated against a commercially available load cell. The load cell could push against the probe tip 104 with known contact forces and displacements. The load cell could be instructed to apply different contact forces and displacements to the probe tip 104 while measuring corresponding resonance response signals. A calibration plot of resonance response signal versus contact force, and resonance response signal versus displacement could be generated. Thus, for the probe tip 104 to maintain a constant contact force on the sample surface, the probe tip 104 could be pushed against the sample surface until the measured resonance response signal corresponds to the desired contact force from the calibrated resonance response signal versus contact force plot. Once the desired contact force is achieved, the stage movement could be aborted and a mechanical, electrical, chemical, optical, and/or photonics measurement performed between the probe tip 104 and the sample. It should be noted that the contacting of the probe tip 104 to the sample surface could be performed under the guidance of a microscope and/or camera. Also, the probe 102 could be off-resonance and a change in its vibrating frequency, phase, and/or amplitude could be used to determine when the probe tip contacts a sample surface.

The resonance response signal technique allows for the probe tip 104 to safely contact conducting, semiconducting, and nonconducting samples while maintaining the integrity of the probe tip and sample.

To perform constant contact force probing, a setpoint frequency, amplitude, and/or phase that corresponds to a desired contact force is selected from the resonance response signal versus contact force plot. The stage is instructed to bring the probe tip 104 into contact with the sample surface. Constant contact force is achieved when the resonance response signal is equivalent to the setpoint frequency, phase, and/or amplitude. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint frequency, phase, and/or amplitude and a resonance response signal. The feedback controller then processes the difference in the setpoint value, and the resonance response signal and it uses the processed difference to continuously adjust the movement of the stage to ensure that constant contact force is maintained on the sample surface. By so doing, the probe tip 104 could induce a constant contact force on the sample surface for longer durations while a mechanical, electrical, chemical, optical, and/or photonics measurement are performed between the probe tip and the sample.

Referring to FIG. 3, in another embodiment, the probe chip 300 could be used as a force or displacement sensor. Second comb-drive C2 serves as a linear variable capacitor whose capacitance changes linearly with in-plane forces that are applied to the probe tip 104. The applied force could be measured by connecting a capacitance or displacement measurement unit across probe 102 and electrode 312. As the probe tip 104 is pushed in-plane, the capacitance at the second comb-drive C2 will increase due to an increase in the overlapping area of fingers 304 and 306. As the probe tip 104 is extended in-plane, the capacitance at second comb-drive C2 will decrease due to a reduction in the overlapping area of fingers 304 and 306. The probe chip 300 could also be used for nanoindentation measurements.

Referring to FIGS. 1-5 in another embodiment, current feedback is used to bring the probe tip 104 and/or side probe tips 204, 404 into contact with the sample surface. This technique works well if the probes 102, 402, 406, probe tips 104, 204, 404 and sample are conductive. Determining that the probe tips 104, 204, 404 have made contact to the sample involve the steps of using a parameter analyzer 184 to apply a potential difference between at least a probe 102, 402, 406 and the sample, and using the same parameter analyzer 184 to measure the current flow between the probe 102, 402, 406 and the sample. The probe chip 100, 200, 300, 400, 500 and/or sample could be mounted on at least a moveable stage, and the stage could be manual, piezoelectric, or stepper motor driven. The probes 102, 402, 406, are mounted at an angle to the sample surface. While the probe tip 104, 204, 404 is not in contact with the sample surface, the current between the probe 102, 402, 406 and sample is measured. The measured current is referred to as the current response signal. The stage is instructed to bring at least a probe tip 104, 204, 404 into contact with the sample surface while measuring the current response signal upon each step movement of the stage. As the probe tip 104, 204, 404 contacts and pushes against the sample surface, current will flow between the probe and the sample. Contact is achieved when there is a difference between the current response signal when the probe tip 104, 204, 404 is not in contact with the sample surface and when the probe tip is in contact with the sample surface.

There is a direct relationship between the measured current response signal, the extent of the probe deflection, and the contact force induced by at least a probe tip 104, 204, 404 on the sample surface. The probe's deflection, current response signal, and contact force could be calibrated against a commercially available load cell. A conductive sample is mounted on a load cell and a potential difference is applied between the sample and at least a probe. The sample on the load cell could push against at least a probe tip with known contact forces and displacements. The load cell could be instructed to apply different contact forces and displacements to at least a probe tip while measuring corresponding current response signals. A calibration plot of current response signal versus contact force, and current response signal versus displacement could be generated. From the current response signal versus displacement plot, a constant contact resistance versus displacement plot could be generated. As the probe tip 104, 204, 404 pushes against the sample surface, at a certain point, the contact resistance would plateau such that further pushing-in of the probe tip 104, 204, 404 into the sample would not result in appreciable change in contact resistance or current response signal. Thus, for the probe tip 104, 204, 404 to maintain a constant contact resistance on the sample surface, the probe tip 104, 204, 404 could be pushed against the sample surface until the contact resistance plateaus. Once the desired contact force and contact resistance are achieved, the stage movement could be aborted and a mechanical, electrical, chemical, optical, and/or photonics measurement performed between at least a probe tip 104, 204, 404 and the sample. It should be noted that the contacting of at least a probe tip 104, 204, 404 to the sample surface could be performed under the guidance of a microscope and/or camera.

The current response signal technique allows for at least a probe tip to safely contact conducting and semiconducting samples while maintaining the integrity of the probe tip and sample.

To perform constant contact resistance probing, a setpoint resistance that corresponds to a desired contact resistance is selected from the constant contact resistance versus displacement plot. The stage is instructed to bring at least a probe tip into contact with the sample surface. Constant contact resistance is achieved when the measured contact resistance is equivalent to the setpoint resistance. Thereafter, a mechanical, electrical, chemical, optical, and/or photonics measurement could be performed between at least a probe tip and the sample.

In a scenario where a constant contact resistance needs to be maintained for several seconds, minutes, hours, or days, a first feedback controller could be used. The goal of the feedback controller is to calculate the difference between a setpoint resistance and a measured contact resistance and process the difference. The processed resistance difference is used by the feedback controller to continuously adjust the movement of the stage to maintain a constant force on the sample while a mechanical, electrical, chemical, optical, and/or photonics measurement are performed between the probe tip and the sample.

Figure 4:
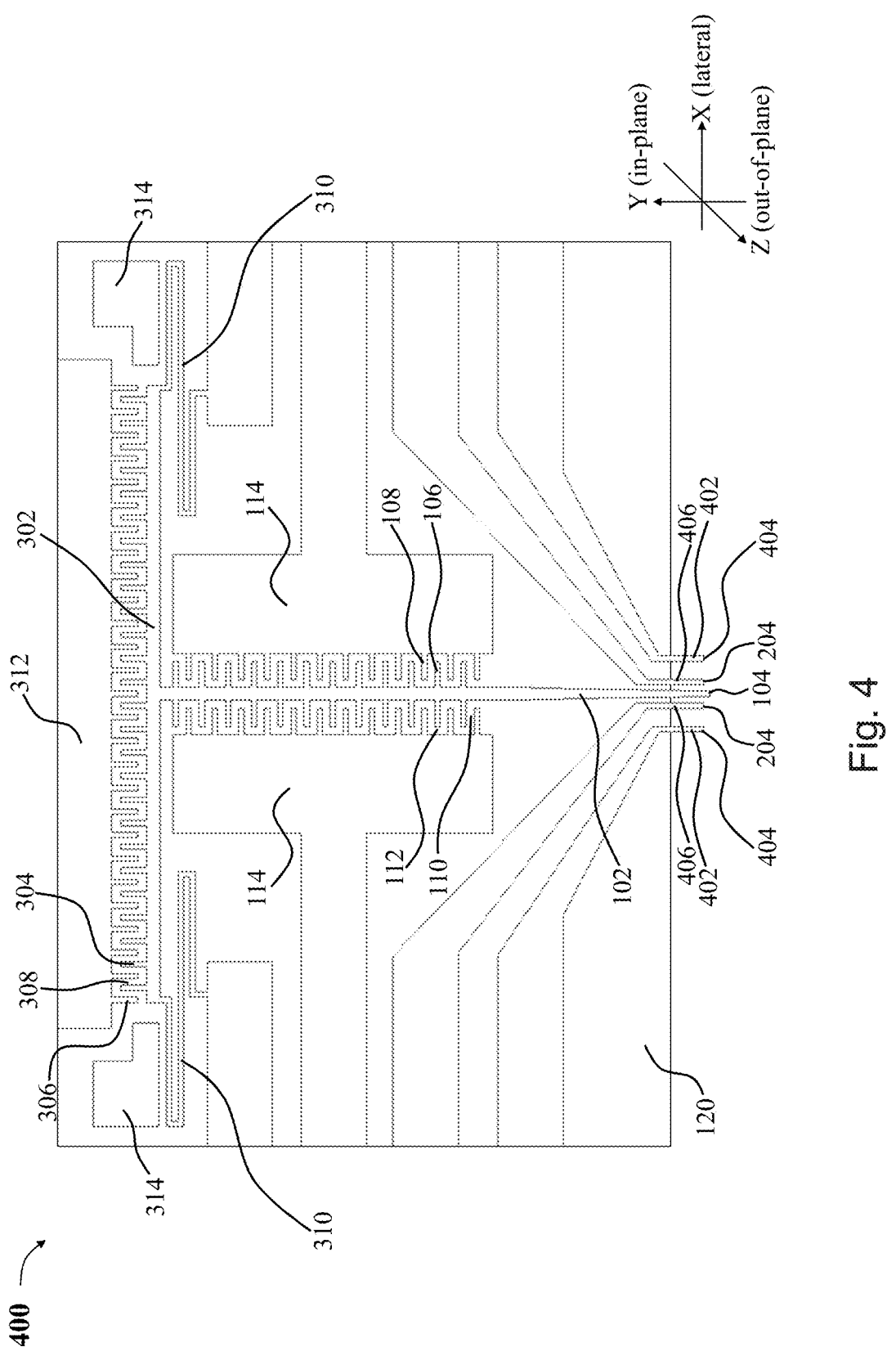
FIG. 4 is a top view of a multiprobe chip, according to aspects of the present disclosure.
Figure 5:
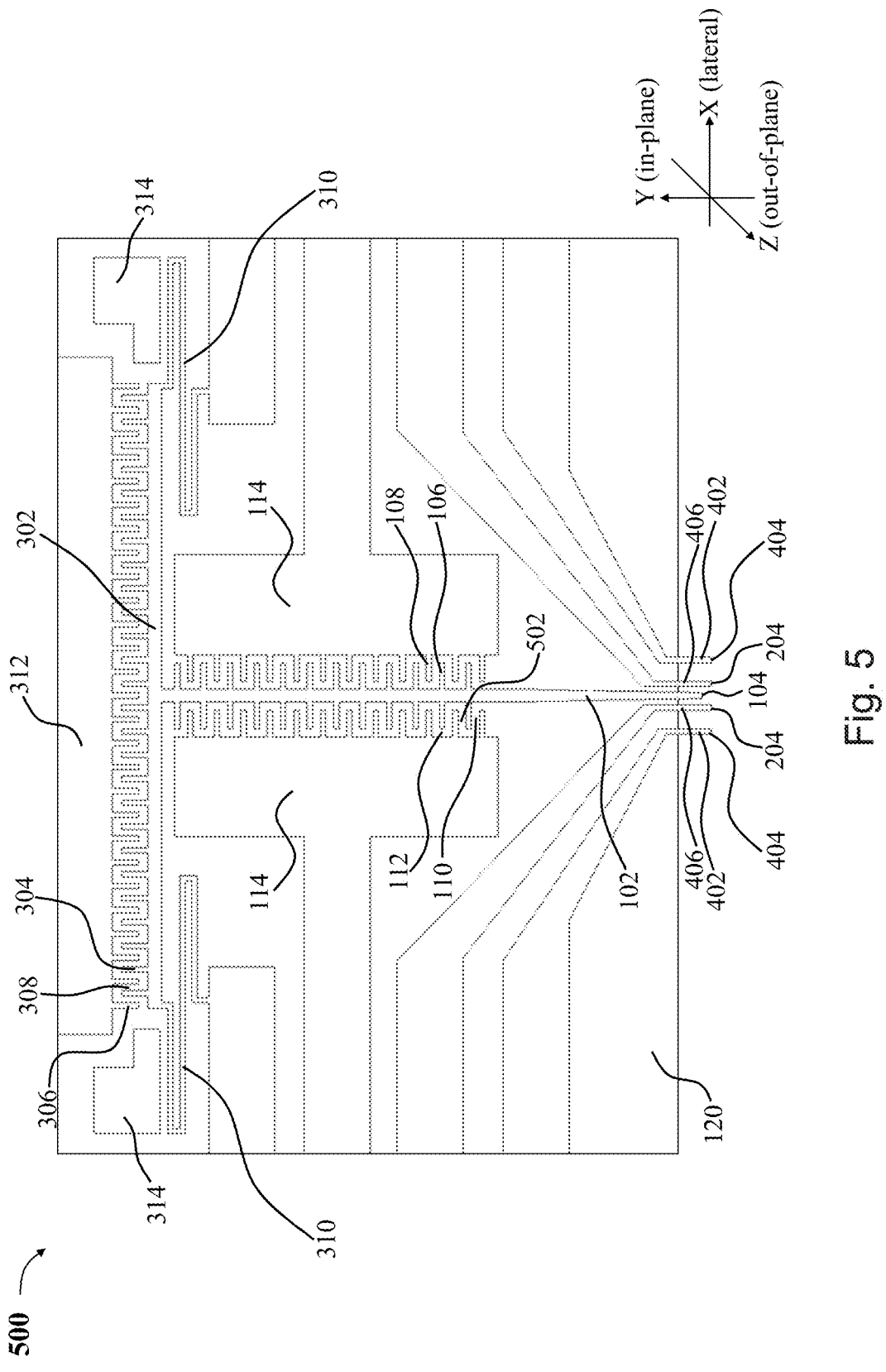
FIG. 5 is a top view of a multiprobe chip, according to aspects of the present disclosure.

Referring to FIGS. 4 and 5, in another embodiment, a current-in-plane response signal technique is used to bring the side probe tips 204, 404 into contact with the sample surface. The current-in-plane response signal technique works well when the sample and probe tips 204, 404 are conductive. Determining that all the side probe tips 204, 404 have made contact to the sample surface involves the steps of using the parameter analyzer 184 to apply a potential difference across at least two of the side probes 402, 406 and using the same parameter analyzer 184 to measure the current flow between the two side probes 402, 406 which have the potential difference applied to. The probe chip 400, 500 and/or sample could be mounted on at least a moveable stage, and the stage could be manual, piezoelectric, or stepper motor driven. The probe chip 400, 500 is mounted at an angle to the sample surface. To contact the probe tips 104, 204, 404 with the sample surface, an alignment routine is performed to ensure that upon contact, all the side probe tips 104, 204, 404 are in contact with the sample surface. While the probe tips 104, 204, 404 are not in contact with the sample surface, the current between the side probes 402, 406 that have the potential difference applied to are measured. The measured current is referred to as the current-in-plane response signal. The stage is instructed to bring the probe tips 104, 204, 404 into contact with the sample surface while measuring the current-in-plane response signal upon each step movement of the stage. As the probe tips 104, 204, 404 contact and pushes against the sample surface, current will flow between at least two of the side probes 402, 406. Contact is achieved when there is a difference between the current-in-plane response signal when the probe tips are not in contact with the sample surface and when the probe tips 104, 204, 404 are in contact with the sample surface.

The current-in-plane response signal technique allows for the probe tips 104, 204, 404 to safely contact conducting and semiconducting samples while maintaining the integrity of the probe tips 104, 204, 404 and sample.

To perform constant contact force probing, a setpoint current that corresponds to a desired contact force is selected. The stage is instructed to bring the side probe tips 204, 404 into contact with the sample surface. Constant contact force is achieved when the current-in-plane response signal is equivalent to the setpoint current. Thereafter, a mechanical, electrical, chemical, optical, and/or photonics measurement could be performed between the probe tips 104, 204, 404 and the sample.

In a scenario where a constant contact force needs to be maintained for several seconds, minutes, hours, or days, a first feedback controller could be used. The goal of the feedback controller is to calculate the difference between a setpoint current and a current-in-plane response signal and process the difference. The processed current difference is used by the feedback controller to continuously adjust the movement of the stage to maintain a constant force on the sample while a mechanical, electrical, chemical, optical, and/or photonics measurement are performed between the probe tips 104, 204, 404 and the sample.

Referring to FIG. 4, in another embodiment, a multiprobe chip 400 is provided. The multiprobe chip 400 comprises of probe chip 300 with integrated side probes 402, 406. The technique of capacitance response signal, intensity response signal, photocurrent response signal, piezoresistance response signal, high frequency response signal, elongated image response signal, contrast response signal, electrical response signal, resonance response signal, current response signal and/or current-in-plane response signal could be used to determine when the probe tips 104, 204, 404 make contact to the sample surface. The multiprobe chip 400, could be used to perform scanning probe microscopy, conductance, permittivity, resistance, resistivity, sheet resistance, and/or 4-wire Kelvin resistance measurements. The middle probe 102 is freely moveable and side probes 402 and 406 are fixed. Side probes 402 and 406 could be used for conductance, permittivity, resistance, resistivity, sheet resistance, and/or 4-wire Kelvin resistance measurements, while the middle probe 102 could be used for scanning probe microscopy (SPM) measurements such as atomic force microscopy (AFM), scanning tunneling microscopy (STM), and nanoindentation.

Referring to FIG. 4, in another embodiment, the middle probe 102 is used to perform SPM measurement on a sample surface, and the acquired image is used to guide the landing of the side probe tips 204, 404 on the sample surface. Thereafter, a conductance, permittivity, resistance, resistivity, sheet resistance, and/or 4-wire Kelvin resistance measurement could be performed on the sample.

Referring to FIG. 4, in another embodiment, the middle probe 102 could be retracted in-plane by using the parameter analyzer 184 to apply actuation voltages to electrode 312. The middle probe 102 could be retracted to be shorter than the side probes 402, 406.

Referring to FIG. 4, in another embodiment, the multi-probe chip 400 is used to perform non-contact probing of samples 132. The probe chip 400 is mounted perpendicular to the sample surface. The probe chip 400 and/or sample 132 are mounted on a moveable stage and the lock-in-amplifier 182 is used to excite the middle probe 102 into resonance or off-resonance. The stage is instructed to bring the middle probe tip 104 into proximity with the sample surface. As the middle probe tip 104 approaches the sample surface, its resonance frequency, phase, and/or amplitude will change. This change in the resonance frequency, phase, and/or amplitude could be used to position the probe tips 104, 204, and 404 in proximity to the sample surface without making direct contact with the sample surface. Electrical signals could be capacitively coupled from the probe tips 104, 204, 404 to the sample to characterize the mechanical, electrical, chemical, optical, and/or photonics properties of the sample. A high frequency signal could be applied to the middle probe 102 to enable scanning microwave impedance microscopy (SMIM) where the permittivity and conductivity of the sample could be extracted with probe tip 104. Charge transport mechanisms in the sample could be investigated by supplying a probing signal to one of the probe tips 104, 204, 404 and picking up a modified version of the probing signal with at least one of the remaining probe tips 104, 204, 404. The probing signal would capacitively couple into the sample and depending on the material properties of the sample, a modified probing signal would be picked up by at least a second probe tip 104, 204, 404. The modified probing signal could have a different phase and/or amplitude. This modified probing signal could contain important information about the sample such as the doping, electron and hole mobility, defects, carrier concentration, crystal structure, resistivity, and many other. The probing signal could be a DC voltage, a high frequency signal, a magnetic signal, optical signal, or a photonics signal. By integrating a magnetic field into the measurement setup, Hall Effect, charge tunneling, and Van der Pauw measurements could be performed on the sample. The middle probe 102 could comprise of a magnetic material such as nickel or cobalt which could induce magnetic field on the sample.

Referring to FIG. 5, in another embodiment, a multiprobe chip 500 provided. The multiprobe chip 500 comprises of probe chip 300 with integrated side probes 402, 406. The technique of capacitance response signal, intensity response signal, photocurrent response signal, piezoresistance response signal, high frequency response signal, elongated image response signal, contrast response signal, electrical response signal, resonance response signal, current response signal and/or current-in-plane response signal could be used to determine when the probe tips 104, 204, 404 make contact to the sample surface. The middle probe 102 is designed to be shorter than the side probes 402 and 406. The middle probe 102 could be fixed or moveable. The probe tips 104, 204, 404 could be used to extract the resistance, conductance, and/or permittivity of the sample. The sample's sheet resistance, resistivity, and 4-wire Kelvin resistance could also be extracted with the probe tips 104, 204, 404. By bringing the side probe tips 204, 404 into contact with a sample surface, the middle probe 102 could be used to gate the transport of charges in the sample. For example, to measure the resistance, sheet resistance, and/or 4-wire Kelvin resistance of a sample, the side probe tips 204, 404 are brought into contact with the sample surface while an airgap exists between the sample surface and the middle probe tip 104. The parameter analyzer 184 is used to source current across the outer side probes 402 and a voltage drop is measured across the inner side probes 406 using the same parameter analyzer 184. To modulate the sample's conductance, permittivity, resistance, sheet resistance, and/or 4-wire Kelvin resistance, a probing signal could be applied to the middle probe 102 while the sample's conductance, permittivity, resistance, sheet resistance, and/or 4-wire Kelvin resistance are being measured by the side probe tips. The middle probe 102 now serves as a gate electrode that carries a probing signal. Changing the amplitude and/or phase of the probing signal could change the conductance, permittivity, resistance, resistivity, sheet resistance, and/or 4-wire Kelvin resistance of the sample. A parametric measurement could be performed whereby every time the amplitude and/or phase of the probing signal is changed, the sample's conductance, permittivity, resistance, resistivity, sheet resistance, and/or 4-wire Kelvin resistance is measured. A plot of the sample's conductance, permittivity, resistance, resistivity, sheet resistance, and/or 4-wire Kelvin resistance versus amplitude or phase of the probing signal could be generated. The probing signal could be a DC voltage, a high frequency signal, a magnetic signal, an optical signal, or a photonics signal. The probing signal could also change the optical, mechanical, electrical, photonics, and/or chemical properties of the sample. The side probe tips 404 in contact with the sample surface while the middle probe tip 104 is in proximity to the sample surface constitutes a transistor configuration. The transistor configuration could be used to quickly investigate the charge transport mechanisms in thin film materials and semiconductors. The transistor configuration eliminates the need for lithographically patterning and depositing metal electrodes on thin film materials to form solid state transistors before performing transistor output and transfer curve measurements. A combination of side probes 402, 406 on the left and right of the middle probe 102 could serve as source or drain electrodes respectively. The middle probe 102 would be the gate electrode. One of the side probe tips 204, 404 could also be dedicated to contact the bulk or backside of the sample.

Referring to FIG. 5, the middle probe 102, beam 302, and meander springs 310 are freely moveable. The modulation of the sample's optical, mechanical, electrical, photonics, and/or chemical properties could be achieved by applying a probing signal to the middle probe 102 while moving the middle probe 102 towards or away from the sample surface. Moving of probe tip 104 towards the sample surface could be achieved by using the parameter analyzer 184 to apply actuation voltages to the side electrodes 114. It should be noted that to use the side electrodes 114 as actuators, the probe 102 should be designed such that the width of the airgaps 110 is smaller than airgap 502. An actuation voltage which is a potential difference is applied across the middle probe 102 and side electrode 114 resulting in an electrostatic force of attraction. The electrostatic force of attraction would tend to move the probe tip 104 closer to the sample surface. A parametric measurement could be performed where at each step position of the middle probe tip, the amplitude of the probing signal could be changed while measuring the conductance, permittivity, resistance, resistivity, sheet resistance, and/or 4-wire Kelvin resistance of the sample. The probing signal could be a DC voltage, high frequency signal, a magnetic signal, an optical signal, or a photonics signal. A plot of the sample's conductance, permittivity, resistance, resistivity, sheet resistance, and/or 4-wire Kelvin resistance versus amplitude of actuation voltage versus amplitude of the probing signal could be generated. Additionally, a plot of the sample's conductance, permittivity, resistance, resistivity, sheet resistance, and/or 4-wire Kelvin resistance versus amplitude of the actuation voltage could be generated. Lastly, a plot of the sample's conductance, permittivity, resistance, resistivity, sheet resistance, and/or 4-wire Kelvin resistance versus amplitude of the probing signal could be generated.

In reference to FIG. 5, the airgap between the middle probe tip 104 and sample could be filled with ambient air, vacuum, other gases, polymers, fluids, electrolytes, etc. In the case of electrolyte, the multiprobe 500 along with the sample could be used as an ion-sensitive field effect transistor (ISFET). A gate dielectric layer is deposited on the sample surface. With or without patterning any metal electrodes on the sample surface, the side probe tips 204, 404 are brought into contact with the sample surface. The side probe tips 204, 404 could either punch-through the gate dielectric to contact the sample or the dielectric layer could first be removed at the spots where the side probe tips contact the sample. The sample and probe tips 104, 204, 404 are placed in an electrolyte where the gap between the middle probe tip 104 and sample is filled with the electrolyte. At least a stage moves the sample and probe tips 104, 204, 404 into contact and the technique of capacitance response signal, intensity response signal, photocurrent response signal, piezoresistance response signal, a high frequency response signal, elongated image response signal, contrast response signal, electrical response signal, resonance response signal, current response signal and/or current-in-plane response signal could be used to determine when the probe tips make contact to or are in proximity to the sample surface. The middle probe tip 104 serves as the gate electrode, a pair of the side probe tips 204, 404 on the left and right of the middle probe 102 serves as the drain and source electrodes respectively. The output curve and transfer curve of the transistor are performed on the sample. While the conductive side probe tips 204, 404 are in contact with the sample, in output curve measurements, a voltage sweep is performed between the source and drain electrodes while stepping the amplitude of the gate voltage (i.e., probing signal) on the conductive middle probe 102. The gate voltage modulates the channel conductance (i.e., charge transport) in the sample right below the dielectric layer. A plot of the current that flows between the drain and source electrodes versus the drain and source voltage sweep constitute the output curve. On the other hand, in transfer curve measurements, a voltage sweep is performed between the gate and source electrodes while stepping the amplitude of the drain voltage. A plot of the current that flows between the drain and source electrodes versus the gate and source voltage sweep constitute the transfer curve. In addition, a gate leakage current could be monitored by plotting the current that flows between the gate and source electrodes versus the gate and source voltage sweep. The source electrode could be electrically grounded during the output curve, transfer curve, and gate leakage curve measurements. The ISFET probing configuration described could be used for biosensing where a biological entity such as an antibody could be immobilized on the dielectric layer and further binding of an antigen to the antibody could cause changes in the output, transfer, and gate leakage curves. The transistor probing configuration described could also be used for gas-sensitive field effect transistor (GSFET) where the probe tips 104, 204, 404 and sample are placed in a gaseous environment and the gap between the middle probe tip and sample is filled with the gas of interest. The introduction of different gases to the sample would change its output curve, transfer curve, and leakage current curve. In addition, for the ISFET and GSFET configurations, while the probing signal is being applied to the middle probe 102, a conductance, permittivity, resistance, resistivity, sheet resistance, and/or 4-wire Kelvin resistance measurement could be performed with the side probe tips 204, 404.

In reference to FIG. 4 and FIG. 5, each probe 102, 402, 406 could be used as a source, drain, gate, or bulk electrode of the transistor. The bulk electrode could apply a backside bias to the sample.

Referring to FIG. 4 and FIG. 5, the multiprobe chip 400, 500 could be designed such that the middle probe 102 is located next to the outer side probe 402. Several probe 102 could also be monolithically integrated to the multiprobe chip 400 and 500. The probe 102 could be fixed or freely moveable.

Figures 6A, 6B:
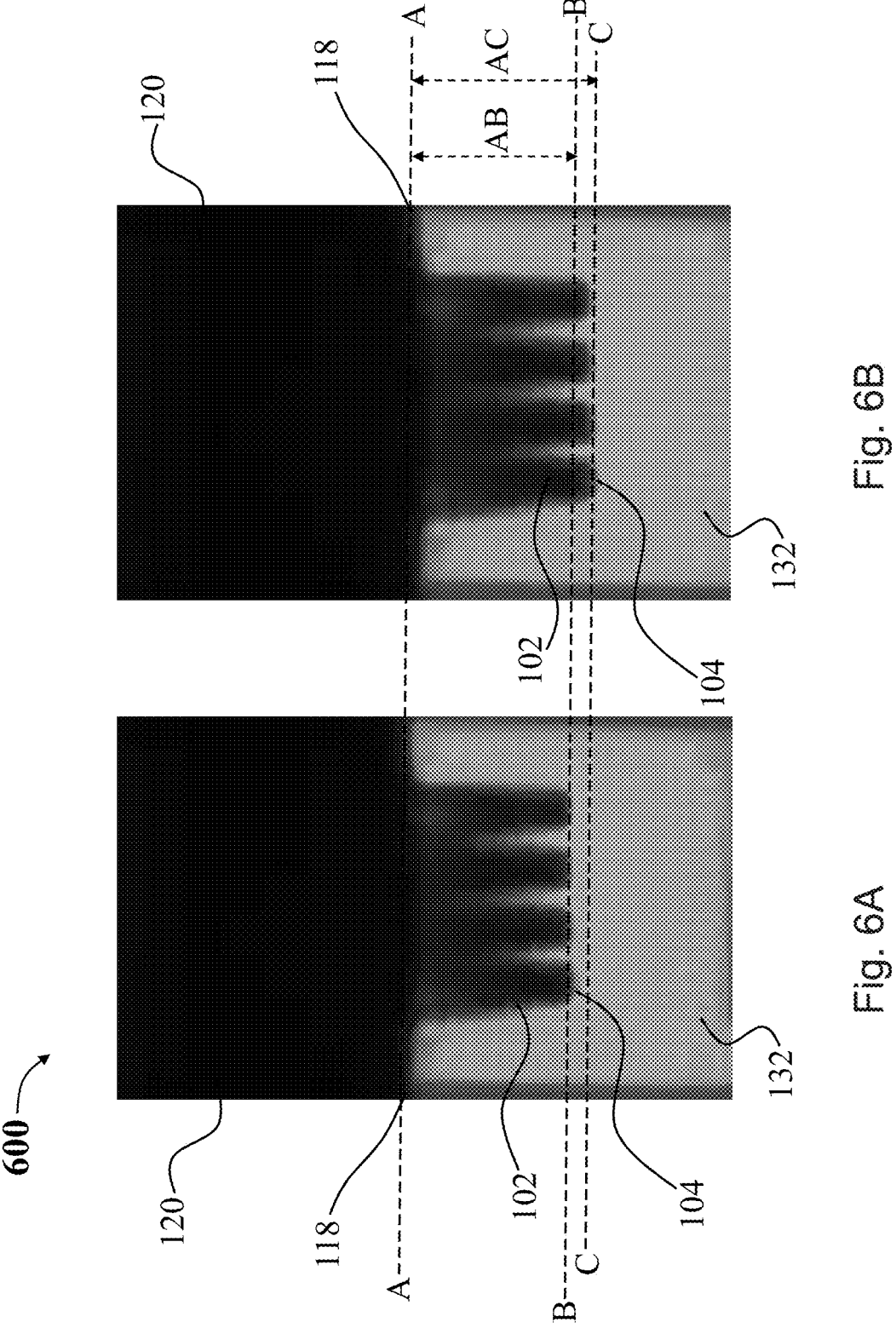
FIG. 6A is a top view of probe tips not in contact with a sample, according to aspects of the present disclosure.
FIG. 6B is a top view of probe tips in contact with a sample, according to aspects of the present disclosure.

Referring to FIG. 6A and FIG. 6B, in another embodiment, determining that the probe tip 104 has made contact to the sample involves the steps of viewing an elongated image 600 of the probe 102. The probe chip 200 may or may not have side electrode 114. The probe chip 200 and/or sample could be mounted on at least a moveable stage, and the stage could be manual, piezoelectric, or stepper motor driven. The probe 102 is mounted at an angle to the sample surface. A microscope that is equipped with a camera is used to observe the probe and sample surface. The microscope could be an optical, scanning electron, or transmission electron microscope. While the probe tip 104 is not in contact with the sample surface, a video stream or image 600 of the probe 102 is recorded as shown in FIG. 6A. The recorded image 600 is referred to as the image response signal. The stage is instructed to bring the probe tip 104 into contact with the sample surface while recording a new image response signal upon each step movement of the stage. As the probe tip 104 contacts and pushes against the sample surface, the probe tip 104 would deflect resulting in an elongated image 600 of the probe 102 as shown in FIG. 6B. Contact is achieved when there is a difference between the image response signal when the probe tip 104 is not in contact with the sample surface and the elongated image response signal when the probe tip 104 is in contact with the sample surface. In FIG. 6A and FIG. 6B, plane AA represents the edge 118 of the substrate 120. Plane BB represents the location of the probe tip 104 when the probe tip is not in contact with sample 132. Plane CC is the new location of the probe tip 104 after the probe tip 104 pushes against the sample surface 132. The distance between plane BB and CC represents the probe's elongation caused by the deflection of the probe 102 upon contact with the sample surface 132. It should be noted that the contacting of the probe tip 104 to the sample surface could be performed without a microscope or camera.

A user could manually or automatically stop the probe tip 104 from overdriving into the sample surface as soon as a desired probe elongation image is captured. To automatically abort the pushing of the probe tip 104 into the sample, a computer vision technique could be used. While the probe tip 104 is not in contact to the sample, its pixel coordinates could be recorded. The probe tip 104 coordinates could be selected and saved by using a computer mouse 166 (see FIG. 1C) to click on the probe tip in the probe image 162 (see FIG. 1C) on the computer monitor 160 (see FIG. 1C). Then, a reference location on the probe chip 200 could be selected with the mouse The reference location is a fixed location on the probe chip 200. As an example, the reference location could be one of the fixed probe fingers 108 or a location on the fixed edge 118 of the substrate 120 that the probe 102 is manufactured on. The distance between the probe tip 104 and reference location is calculated in pixels (AB). This distance is referred to as the tip-reference length (AB). The stage is instructed to bring the probe tip 104 into contact with the sample surface while the tip-reference length is computed upon each step movement of the stage. The probe tip 104 is pushed against the sample surface until the probe is visually elongated and the calculated tip-reference length (AC) exceeds the tip-reference length (AB). At this point, the stage stops moving and the desired mechanical, electrical, chemical, optical, and/or photonics measurement could be performed between the probe tip and the sample.

There is a direct relationship between the elongated tip-reference length (AC), the extent of the probe deflection, and the contact force induced by the probe tip 104 on the sample surface. The probe's deflection, elongated tip-reference length (AC), and contact force could be calibrated against a commercially available load cell. The load cell could push against the probe tip 104 with known contact forces and displacements. The load cell could be instructed to apply different contact forces and displacements to the probe tip 104 while calculating the corresponding tip-reference lengths. A calibration plot of tip-reference length versus contact force, and tip-reference length versus displacement could be generated. Thus, for the probe tip 104 to maintain a constant contact force on the sample surface, the probe tip 104 could be pushed against the sample surface until the calculated elongated tip-reference length (AC) corresponds to the desired contact force from the calibrated tip-reference length versus contact force plot. Once the desired contact force is achieved, the stage movement could be aborted and a mechanical, electrical, chemical, optical, and/or photonics measurement performed between the probe tip and the sample.

The elongated tip-reference length technique allows for the probe tip 104 to safely contact conducting, semiconducting, and nonconducting samples while maintaining the integrity of the probe tip and sample.

To perform constant contact force probing, a setpoint tip-reference length that corresponds to a desired contact force is selected from the tip-reference length versus contact force plot. The stage is instructed to bring the probe tip 104 into contact with the sample surface. Constant contact force is achieved when the elongated tip-reference length (AC) is equivalent to the setpoint tip-reference length. Thereafter, a mechanical, electrical, chemical, optical, and/or photonics measurement could be performed between the probe tip and the sample.

In a scenario where a constant contact force needs to be maintained for several seconds, minutes, hours, or days, a first feedback controller could be used. The goal of the feedback controller is to calculate the difference between a setpoint tip-reference length and an elongated tip-reference length (AC) and process the difference. The processed tip-reference length difference is used to continuously adjust the movement of the stage to ensure that the calculated elongated tip-reference length (AC) is equivalent to the setpoint tip-reference length. By so doing, the probe tip could induce a constant contact force on the sample surface for longer durations while a mechanical, electrical, chemical, optical, and/or photonics measurement are performed between the probe tip and the sample.

It should be noted that all the techniques and measurement methods described could be performed under a magnetic field. Once a magnet is integrated into the setup, Hall Effect and charge tunneling measurements could also be performed on the sample.

Additionally, it should be noted that multiple techniques could be simultaneous used to determine when the probe tip 104 contacts the sample. As an example, both current response signal and capacitance response signal could be simultaneously used to determine when the probe tip contacts the sample.

Lastly, it should be noted that there are several ways of determining when a probe 102 with a probe tip 104 has contacted a sample surface as well as performing constant contact force probing. The methods described in this application do not serve to limit the use of other innovative ways to achieve desired outcomes.

Figure 7:
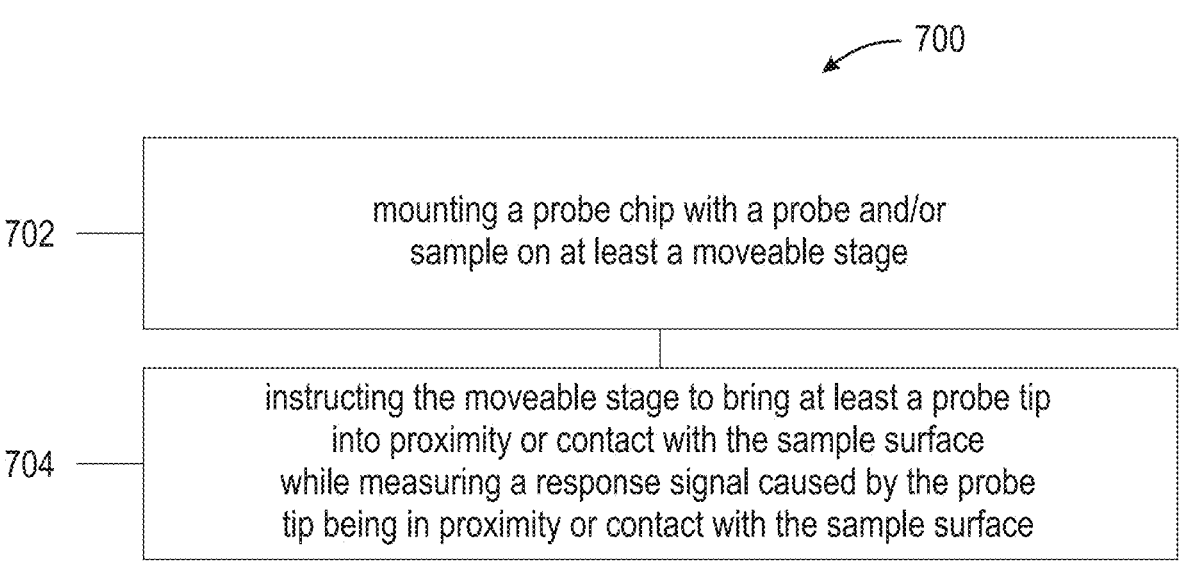
FIG. 7 is a flowchart of a method for determining when at least a probe tip is in proximity of or in contact with a same surface, according to aspects of the present disclosure.

FIG. 7 is a flowchart of a method 700 for determining when at least a probe tip is in proximity to or in contact with a sample surface. The method 700 includes mounting 702 a probe chip with a probe and/or sample on at least a moveable stage. The method 700 further includes instructing 704 the moveable stage to bring at least a probe tip into proximity or contact with the sample surface while measuring a response signal caused by the probe tip being in proximity or contact with the sample surface.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements can optionally be present other than the elements specifically identified by the "and/or" clause, whether related or unrelated to those elements specifically identified.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements can optionally be present other than the elements specifically identified within the list of elements to which the phrase "at least one" refers, whether related or unrelated to those elements specifically identified.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The above-described examples of the described subject matter can be implemented in any of numerous ways. For example, some aspects can be implemented using hardware, software, or a combination thereof. When any aspect is implemented at least in part in software, the software code can be executed on any suitable processor or collection of processors, whether provided in a single device or computer or distributed among multiple devices/computers.

The present disclosure can be implemented as a system, a method, and/or a computer program product at any possible technical detail level of integration. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some examples, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to examples of the disclosure. It will be understood that each block of the flowchart illustrations and/or block diagrams, and combinations of blocks in the flowchart illustrations and/or block diagrams, can be implemented by computer readable program instructions.

The computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various examples of the present disclosure. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Other implementations are within the scope of the following claims and other claims to which the applicant can be entitled.

While various examples have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the examples described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize or be able to ascertain using no more than routine experimentation, many equivalents to the specific examples described herein. It is, therefore, to be understood that the foregoing examples are presented by way of example only and that, within the scope of the appended claims and equivalents thereto, examples can be practiced otherwise than as specifically described and claimed. Examples of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is an elongated image response signal of the probe, and determining that the probe tip has made contact to the sample surface comprises the steps of:

using a camera to capture and view the probe;

instructing a stage to incrementally move the probe tip into contact with the sample surface while viewing the probe upon each step movement of the stage;

using the camera to view an elongation of the probe due to the probe tip pushing against the sample surface; and determining that contact is achieved when there is an elongated image of the probe.

2. The method of claim 1, wherein a set of fingers are monolithically integrated with the probe.

3. The method of claim 2, wherein each finger in the set of fingers is isolated by airgaps.

4. The method of claim 1, wherein at least a side electrode is monolithically integrated with the probe.

5. The method of claim 4, wherein a set of fingers are monolithically integrated with the side electrode.

6. The method of claim 1, wherein the probe chip is a multiprobe.

7. The method of claim 1, wherein the response signal is measured while the probe and/or the sample is arranged under an objective lens of a microscope.

8. The method of claim 1, wherein the probe chip is a multiprobe chip comprising a plurality of probes, each of the plurality of probes having a probe tip, and a stage is instructed to bring the probe tips into contact or proximity with the sample surface.

9. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a capacitance response signal, and determining that the probe tip has made contact to the sample surface further comprises the steps of:

measuring a capacitance between the probe and at least a monolithically integrated side electrode when the probe tip is not in contact with the sample surface;

instructing a stage to incrementally move the probe tip into contact with the sample surface while measuring the capacitance between the probe and side electrode upon each step movement of the stage; and determining that contact is achieved when there is a difference between the measured capacitance when the probe tip is not in contact with the sample surface and when the probe tip is in contact with the sample surface.

10. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein bringing the probe tip into contact with the sample surface comprises the steps of:

selecting, using a pattern recognition algorithm, a reference location on the sample;

saving, in a memory of a computer, a pixel coordinate of the reference location;

using the pattern recognition algorithm to identify the probe tip and saving its pixel value;

instructing one or more translational stages to position the reference location below the probe tip;

instructing the one or more translational stages to bring the probe tip into contact with the reference location; and continuously adjusting the position of the translational stages to ensure that the probe tip is always positioned at the reference location on the sample surface.

11. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is an intensity response signal, and determining that the probe tip has made contact to the sample surface comprises the steps of:

directing an incidence beam at one or more interdigitated airgaps between the probe and at least a monolithically integrated side electrode;

using a photodetector to measure an intensity or location of a reflected beam corresponding to the incidence beam when the probe tip is not in contact with the sample surface;

instructing a stage to incrementally move the sample into contact with the probe tip while measuring the intensity or location of the reflected beam at each step movement of the stage; and determining that contact is achieved when there is a difference between the measured intensity or location of the reflected beam when the probe tip is not in contact with the sample surface and when the probe tip is in contact with the sample surface.

12. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a photocurrent response signal, and determining that the probe tip has made contact to the sample surface comprises the steps of:

directing an incidence beam at one or more interdigitated airgaps between the probe and at least a monolithically integrated side electrode;

using a monolithically integrated photodetector to generate a photocurrent as a result of a transmitted beam hitting on the monolithically integrated photodetector, wherein the transmitted beam is a transmitted portion of the incidence beam;

measuring the photocurrent when the probe tip is not in contact with the sample surface;

instructing a stage to bring the sample into contact with the probe tip while measuring the photocurrent response signal at each step movement of the stage; and determining that contact is achieved when there is a difference between the measured photocurrent when the probe tip is not in contact with the sample surface and when the probe tip is in contact with the sample surface.

13. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a piezoresistance response signal, and determining that the probe tip has made contact to the sample surface comprises the steps of:

using a monolithically integrated piezoresistor of the probe to measure a piezoresistance corresponding to a deflection of the probe when the probe tip is not in contact with the sample surface;

instructing a stage to incrementally move the probe tip into contact with the sample surface while measuring the deflection of the probe with the monolithically integrated piezoresistor at each step movement of the stage; and determining that contact is achieved when there is a difference between the measured piezoresistance when the probe tip is not in contact with the sample surface and when the probe tip is in contact with the sample surface.

14. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a high frequency response signal, and determining that the probe tip has made contact to the sample surface comprises the steps of:

applying a high frequency signal to the probe;

measuring an amplitude and/or a phase of a transmitted and/or a reflected signal of the high frequency signal when the probe tip is not in contact with the sample surface;

instructing a stage to bring the probe tip into contact with the sample surface while measuring the amplitude and/or the phase of the transmitted and/or reflected signal of the probe at each step movement of the stage; and determining that contact is achieved when there is a difference between the measured amplitude and/or phase of the transmitted and/or the reflected signal when the probe tip is not in contact with the sample surface and when the probe tip is in contact with the sample surface.

15. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a contrast response signal of the probe and/or sample, and determining that the probe tip has made contact to the sample surface comprises the steps of:

placing the probe and the sample inside an electron microscope;

instructing a stage to bring the sample into contact with a probe tip surface of the probe tip while monitoring a change in contrast or color of the probe and/or sample at each step movement of the stage; and determining that contact is achieved immediately there is a change in contrast or color of the probe and/or the sample surface.

16. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is an electrical response signal, and determining that the probe tip has made contact to the sample surface comprises the steps of:

applying an electrical signal to a probe that is integrated with a set of fingers;

connecting at least a monolithically integrated side electrode that is integrated with the set of fingers to a signal measurement unit;

instructing a stage to incrementally move the probe tip into contact with the sample surface;

pushing the probe tip against the sample surface until at least one of the set of fingers on the probe contacts the fingers on the monolithically integrated side electrode causing the electrical signal to transfer from the probe to the monolithically integrated side electrode;

using the signal measurement unit to measure the transfer of the electrical signal from the probe to the monolithically integrated side electrode at each step movement of the stage; and determining that contact is achieved when there is a transfer of electrical signal from the probe to the monolithically integrated side electrode.

17. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a resonance response signal, and determining that the probe tip has made contact to the sample surface comprises the steps of:

exciting the probe into resonance causing the probe to vibrate;

measuring a resonance frequency, amplitude, and/or phase of the probe when the probe tip is not in contact with the sample surface;

instructing the moveable stage to incrementally move the sample into proximity or contact with the probe tip while measuring the resonance frequency, amplitude, and/or phase of the probe upon each step movement of the moveable stage;

measuring a change in the resonance frequency, amplitude, and/or phase of the probe when the probe tip is in proximity or contact with the sample surface; and determining that contact is achieved when there is a change in the resonance frequency, amplitude, and/or phase of the probe.

18. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the response signal is a current response signal, and determining that the probe tip has made contact to the sample surface comprises the steps of:

applying a potential difference between the sample and the probe tip;

measuring a current between the probe tip and sample when the probe tip is not in contact with the sample surface;

instructing a stage to incrementally move the probe tip into contact with the sample surface while measuring the current between the probe tip and the sample at each step movement of the stage; and determining that contact is achieved when the measured current when the probe tip is not in contact with the sample surface is less than the measured current when the probe tip is in contact with the sample surface.

19. A method for determining when at least a probe with at least a probe tip is in proximity to or in contact with a sample surface of a sample, comprising the steps of:

mounting a probe chip with a probe and/or sample on at least a moveable stage; and instructing the moveable stage to bring at least a probe tip into proximity or contact with the sample surface while measuring a response signal caused by the probe tip being in proximity or contact with the sample surface, wherein the probe chip is a multiprobe chip comprising a plurality of probes, each of the plurality of probes having a probe tip, and the response signal is a current-in-plane response signal, and determining that the probe tips of the plurality of probes have made contact to the sample surface comprises the steps of:

applying a potential difference across at least two probes of the plurality of probes;

measuring a current-in-plane flow between the two probes with the applied potential difference when at least two probe tips corresponding to the at least two probes are separated from the sample surface;

instructing a stage to incrementally move the at least two probe tips into contact with the sample surface while measuring the current flow between the at least two probes with the applied potential difference at each step movement of the stage; and determining that contact is achieved when the measured current-in-plane when the probe tips are not in contact with the sample surface is less than the measured current-in-plane when the probe tips are in contact with the sample surface.

* * * * *